(12) United States Patent
Chun et al.

(10) Patent No.: US 10,719,009 B2
(45) Date of Patent: Jul. 21, 2020

(54) PHOTO MASK AND METHOD OF MANUFACTURING SEMICONDUCTOR ELEMENT USING PHOTO MASK

(71) Applicant: Samsung Display Co., Ltd., Yongin-Si, Gyeonggi-Do (KR)

(72) Inventors: Jun Chun, Hwaseong-si (KR); Junhong Park, Suwon-si (KR); Gwangmin Cha, Hwaseong-si (KR); Hoon Kang, Yongin-si (KR); Jeongmin Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/184,431

(22) Filed: Nov. 8, 2018

(65) Prior Publication Data
US 2019/0148156 A1 May 16, 2019

(30) Foreign Application Priority Data
Nov. 15, 2017 (KR) ......................... 10-2017-0152484

(51) Int. Cl.
*G03F 1/40* (2012.01)
*G03F 1/50* (2012.01)
*G03F 7/40* (2006.01)
*H01L 21/308* (2006.01)

(52) U.S. Cl.
CPC .................. *G03F 1/40* (2013.01); *G03F 1/50* (2013.01); *G03F 7/40* (2013.01); *H01L 21/3086* (2013.01)

(58) Field of Classification Search
CPC ..................................... G03F 1/40; G03F 1/50
USPC ............................................................ 430/5
See application file for complete search history.

(56) References Cited

U.S. PATENT DOCUMENTS

| 6,461,886 B1 | 10/2002 | Uehara et al. |
| 8,420,546 B2 | 4/2013 | Uehara et al. |
| 2004/0157168 A1 | 8/2004 | Huang et al. |

*Primary Examiner* — Christopher G Young
(74) *Attorney, Agent, or Firm* — Cantor Colburn LLP

(57) ABSTRACT

A photo mask includes a transparent substrate, a transflective member, and a light shielding member. The transparent substrate has a transflective region including a first region, a second region located in opposing lateral portions of the first region, and an edge region located adjacent to the first and second regions, and a light shielding region surrounding the transflective region. The transflective member is disposed in the first, second and edge regions under the transparent substrate, and has a different light transmittance in each of the first, second and edge regions. The light shielding member is disposed in the light shielding region under the transparent substrate, and defines an opening which exposes the transflective region. The light shielding member includes a long side extending in a first direction parallel to an upper surface of the transparent substrate and a short side extending in a second direction.

12 Claims, 34 Drawing Sheets

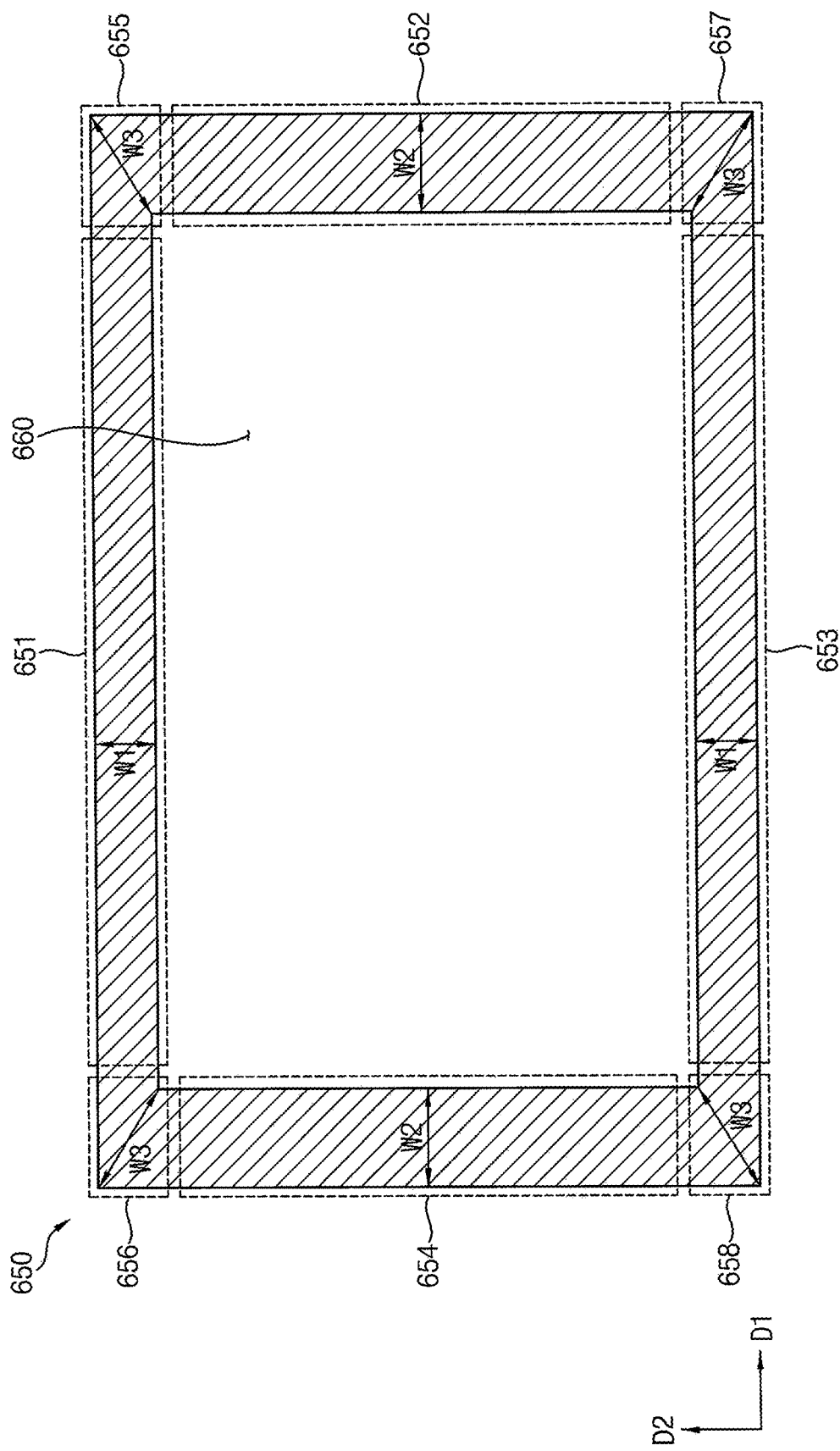

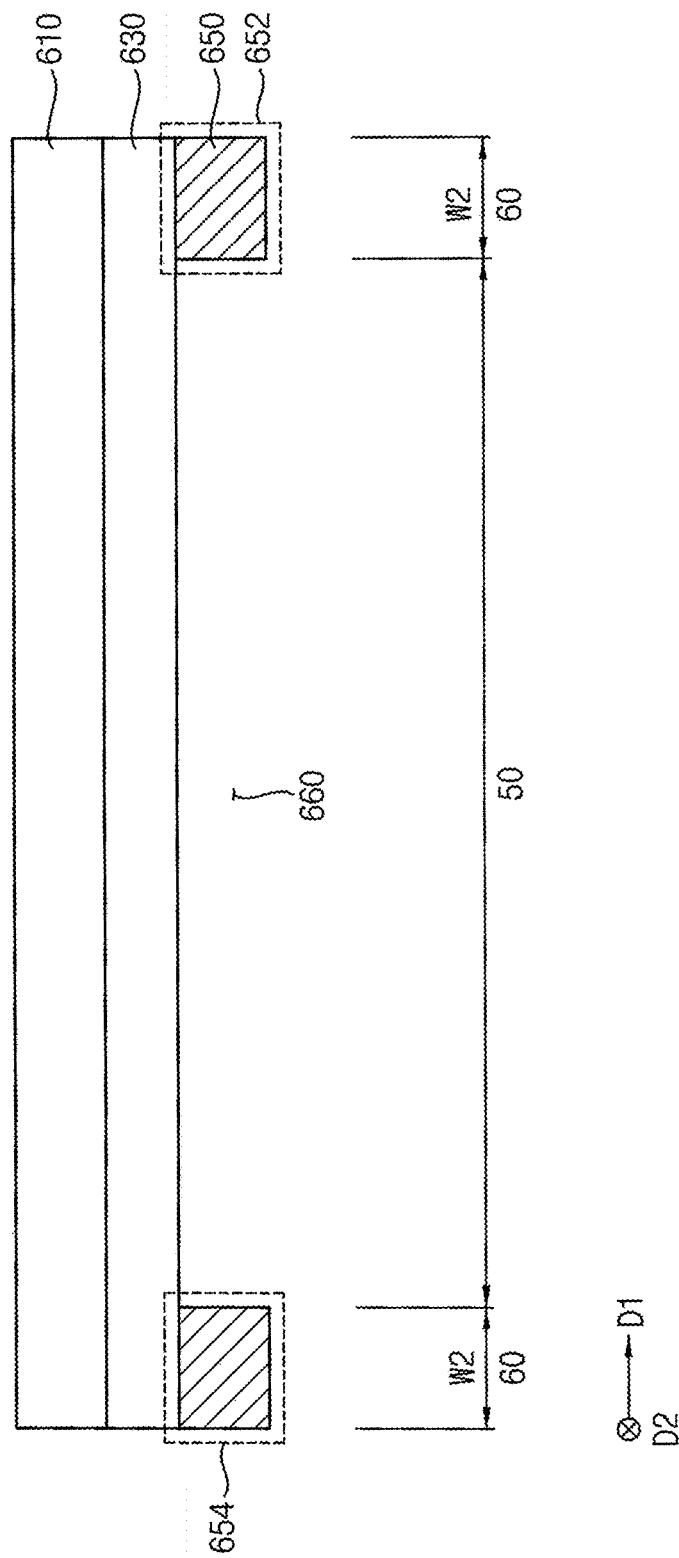

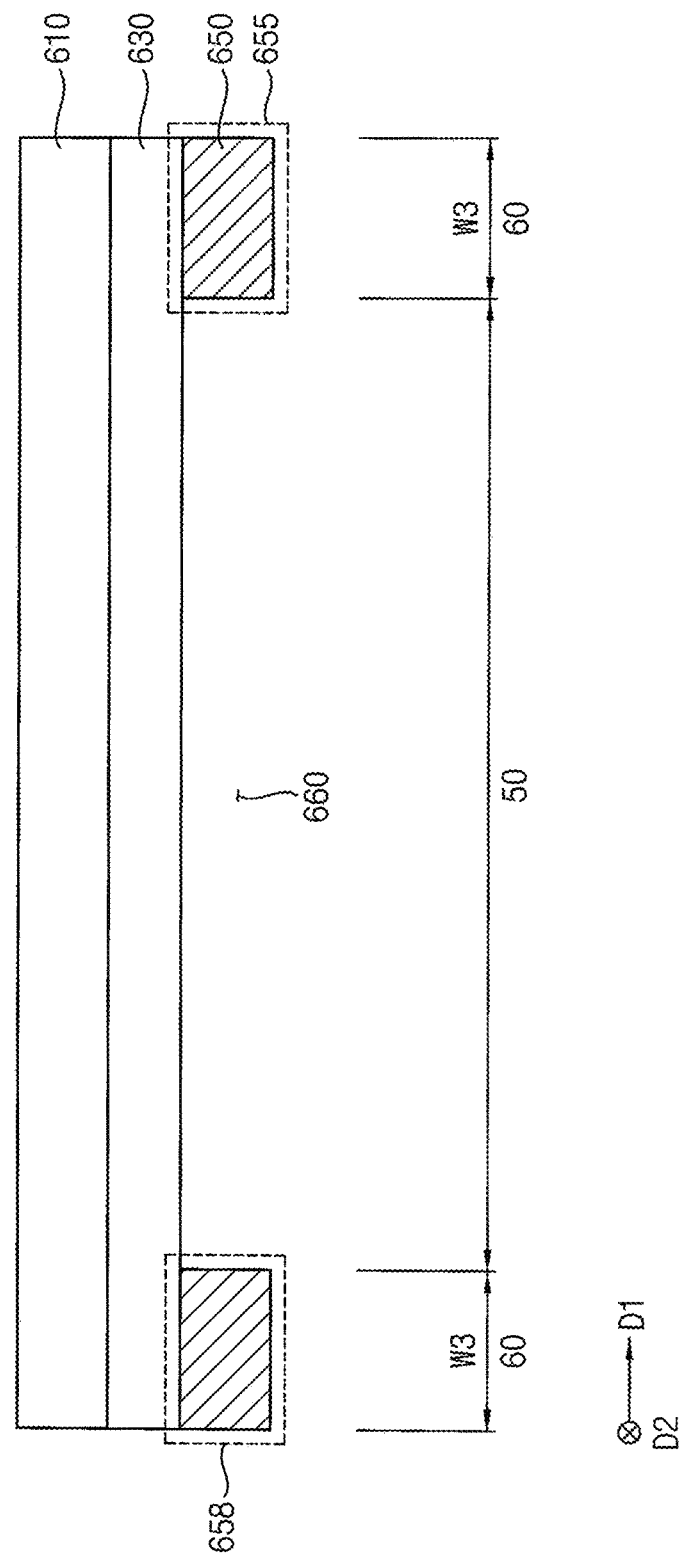

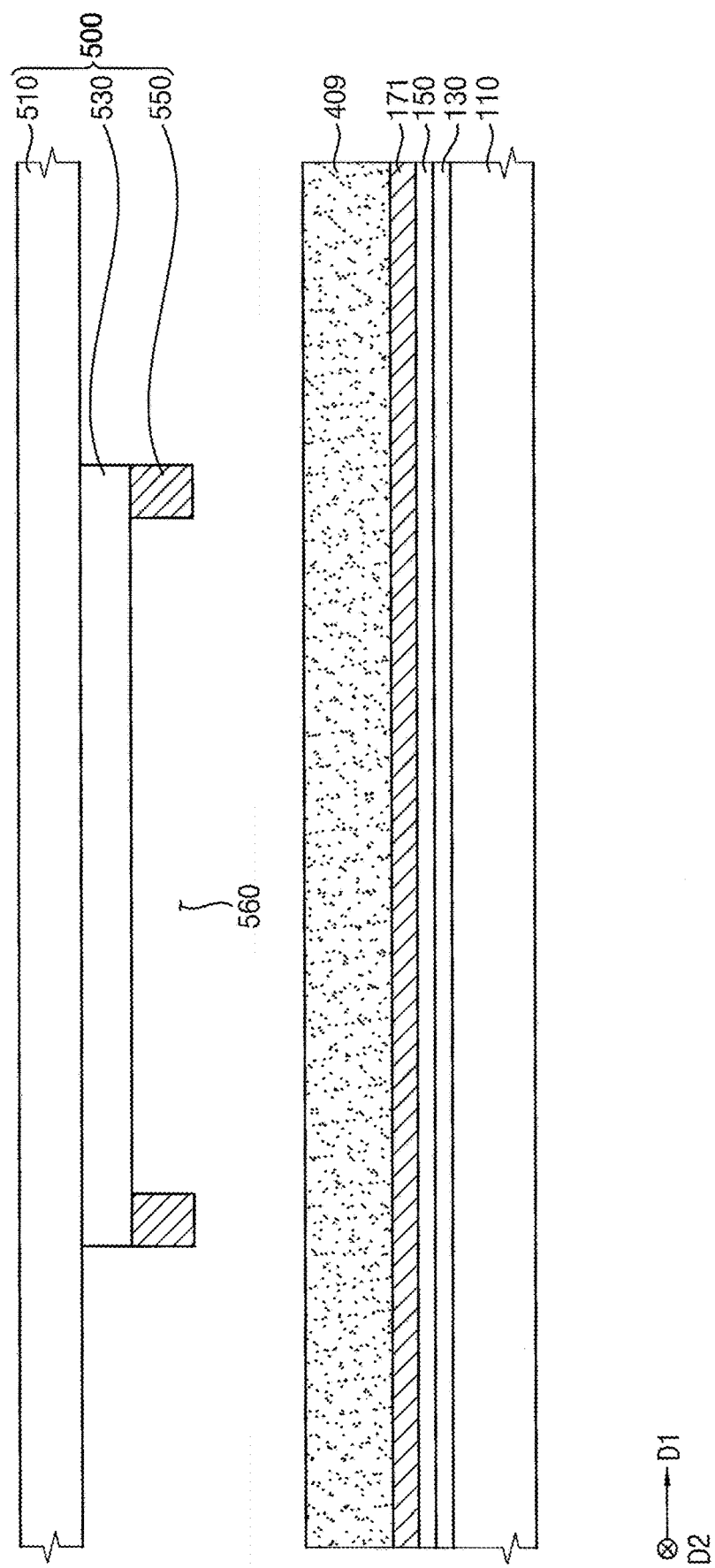

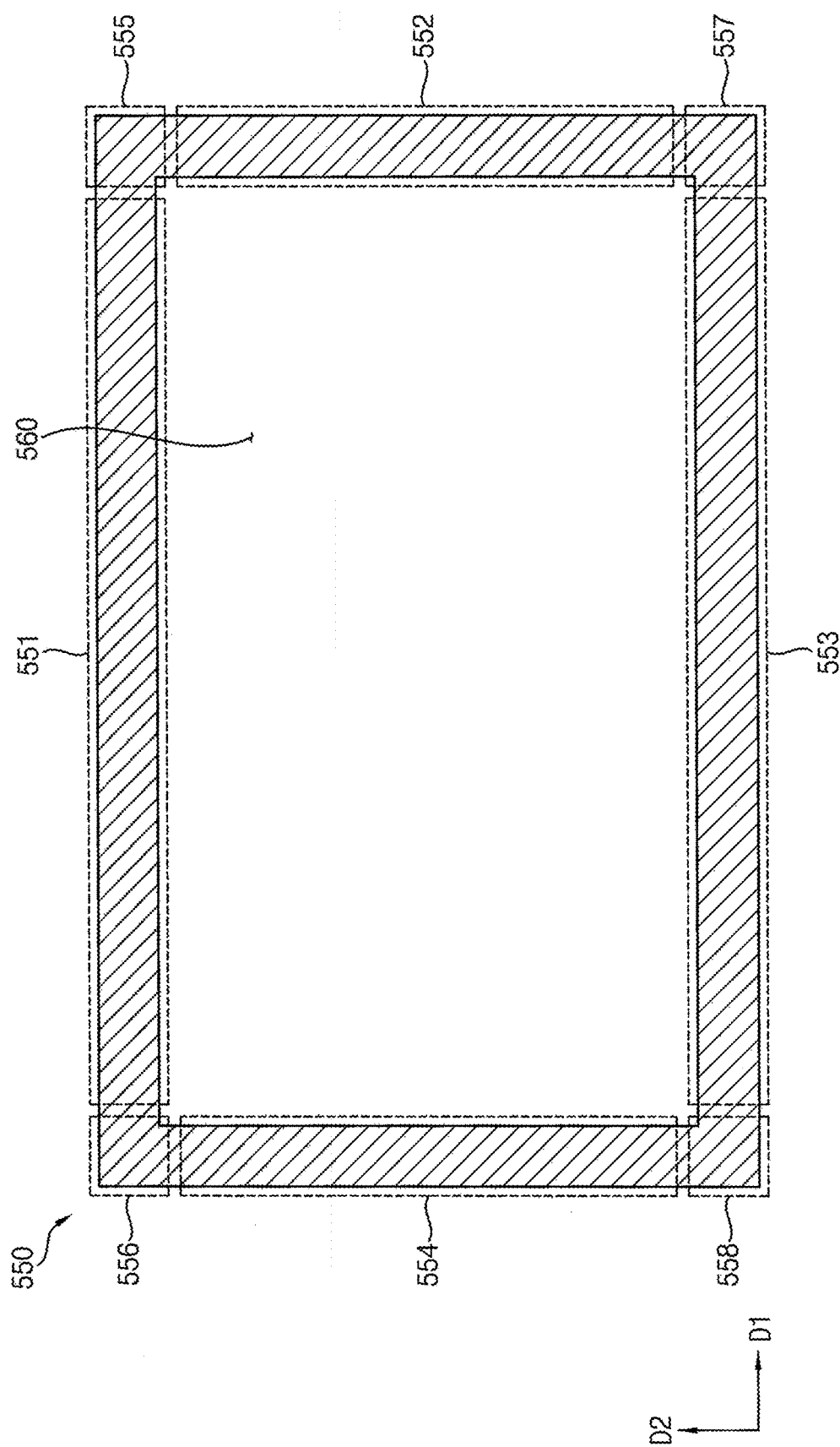

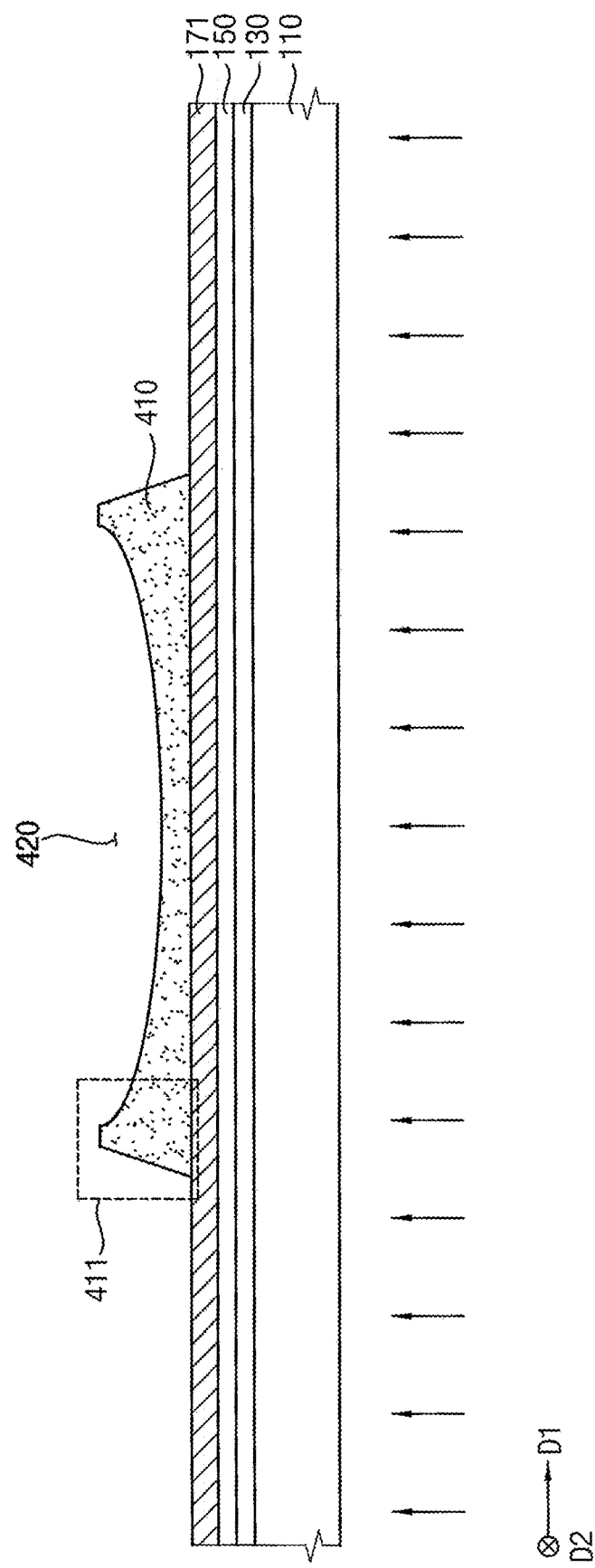

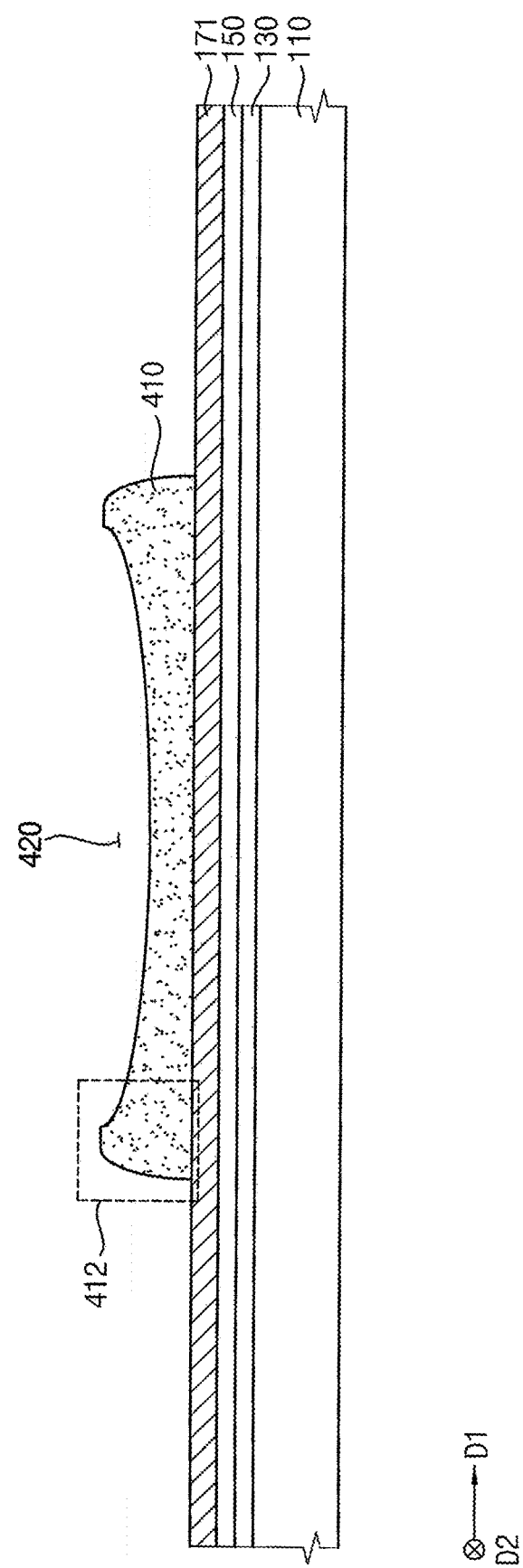

PHOTO MASK AND METHOD OF MANUFACTURING SEMICONDUCTOR ELEMENT USING PHOTO MASK

This application claims priority to Korean Patent Application No. 10-2017-0152484, filed on Nov. 15, 2017, and all the benefits accruing therefrom under 35 U.S.C. § 119, the content of which in its entirety is herein incorporated by reference.

BACKGROUND

1. Field

Exemplary embodiments relate generally to a photo mask and a method of manufacturing a semiconductor element using the photo mask. More particularly, embodiments of the invention relate to a photo mask including a transflective member and a method of manufacturing a semiconductor element using the photo mask.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting display ("OLED") device.

Recently, a display device may include a plurality of semiconductor elements and capacitors, etc. Here, a photo mask process may be performed in a process for forming a gate electrode pattern.

SUMMARY

In a photo mask process, for example, after a photoresist pattern is formed on a preliminary gate electrode layer, a post bake process may be performed in the photoresist pattern. When the post bake process is performed, a reflow phenomenon may occur in an outer portion of the photoresist pattern, and the amount of photoresist to be reflowed may be different according to a shape of the outer portion of the photoresist pattern (e.g., the amount of photoresist to be reflowed in a long side of the outer portion of the photoresist pattern may be relatively greater than the amount of the photoresist pattern to be reflowed in a short side of the outer portion of the photoresist pattern). In this case, a critical dimension ("CD") skew, which is the difference between an after develop inspection ("ADI") CD of the photoresist pattern and an after cleaning inspection ("ACI") CD of the gate electrode pattern, may be out of a tolerance range, and a defect of the gate electrode pattern may occur.

An exemplary embodiment provides a photo mask including a transflective member.

An exemplary embodiment provides a method of manufacturing a semiconductor element using a photo mask including a transflective member.

According to an exemplary embodiment, a photo mask includes a transparent substrate, a transflective member, and a light shielding member. In such an embodiment, the transparent substrate includes a transflective region including a first region, a second region located in opposing lateral portions of the first region and an edge region located adjacent to the first and second regions, and a light shielding region surrounding the transflective region. In such an embodiment, the transflective member is disposed in the first, second and edge regions on a lower surface of the transparent substrate, and has a different light transmittance in each of the first, second, and edge regions. In such an embodiment, the light shielding member is disposed in the light shielding region on the lower surface of the transparent substrate, and defines an opening that exposes the transflective region. In such an embodiment, the light shielding member includes a long side extending in a first direction parallel to an upper surface of the transparent substrate and a short side extending in a second direction different from the first direction.

In an exemplary embodiment, a light transmittance of the transflective member may be gradually increased in a direction from an outside of the transflective member into an inside of the transflective member.

In an exemplary embodiment, the long side may be located adjacent to the first region, and the short side may be located adjacent to the second region.

In an exemplary embodiment, the light shielding member may further include an intersection portion located in a portion where the long side crosses the short side. In such an embodiment, the intersection portion may be located adjacent to the edge region. In such an embodiment, a light transmittance of the transflective member located in the first region may be greater than a light transmittance of the transflective member located in the second region, and a light transmittance of the transflective member located in the edge region may be less than the light transmittance of the transflective member located in the second region.

In an exemplary embodiment, the long side of the light shielding member may include a first long side and a second long side facing the first long side, and the short side of the light shielding member includes a first short side and a second short side facing the first short side. In such an embodiment, the intersection portion of the shielding member may include a first intersection portion located in a portion where the first long side crosses the first short side, a second intersection portion located in a portion where the first long side crosses the second short side, a third intersection portion located in a portion where the second long side crosses the first short side, and a fourth intersection portion located in a portion where the second long side crosses the second short side.

In an exemplary embodiment, the edge region may be located adjacent to the first, second, third, and fourth intersection portions.

In an exemplary embodiment, the transflective member may be disposed on an entire portion of the lower surface of the transparent substrate, and the light shielding member may be in direct contact with a lower surface of the transflective member.

In an exemplary embodiment, the transflective member may be disposed in the opening of the light shielding member, and the light shielding member may be in direct contact with the lower surface of the transparent substrate.

According to an exemplary embodiment, a photo mask includes a transparent substrate, a transflective member, and a light shielding member. In such an embodiment, the transparent substrate includes a transflective region and a light shielding region surrounding the transflective region. In such an embodiment, the transflective member is disposed on a lower surface of the transparent substrate. In such an embodiment, the light shielding member is disposed in the light shielding region on a lower surface of the transflective member, and defines an opening that exposes the transflective region. In such an embodiment, the light shielding member may include a long side extending in a first direction parallel to an upper surface of the transparent substrate and a short side extending in a second direction different from the first direction. In such an embodiment, a width of the long side in the second direction is less than a width of the short side in the first direction.

In an exemplary embodiment, the light shielding member may further include an intersection portion located in a portion where the long side crosses the short side. In such an embodiment, a width of the intersection portion in a diagonal direction may be greater than the width of the short side.

In an exemplary embodiment, the long side of the light shielding member may include a first long side and a second long side facing the first long side. In such an embodiment, the short side of the light shielding member may include a first short side and a second short side facing the first short side. In such an embodiment, the intersection portion of the shielding member may include a first intersection portion located in a portion where the first long side crosses the first short side, a second intersection portion located in a portion where the first long side crosses the second short side, a third intersection portion located in a portion where the second long side crosses the first short side, and a fourth intersection portion located in a portion where the second long side crosses the second short side.

In an exemplary embodiment, a light transmittance of the transflective member may gradually increase in a direction from an outside of the transflective member into an inside of the transflective member.

According to an exemplary embodiment, a method of manufacturing a semiconductor element using a photo mask includes: preparing a substrate; providing an active pattern on the substrate; providing a preliminary gate electrode layer on the active pattern; applying a photoresist on the preliminary gate electrode layer; disposing the photo mask on the photoresist; forming a first photoresist pattern including a recess, where the photo resist pattern has a thickness gradually decreasing along a direction from an outside into an inside on a portion of the preliminary gate electrode layer, by performing an exposure process using the photo mask; forming a first gate electrode pattern by performing a first etch process using the first photoresist pattern as a mask; and forming source and drain electrodes on the first gate electrode pattern.

In an exemplary embodiment, the photo mask may include a transparent substrate including: a transflective region including a first region, a second region located in opposing lateral portions of the first region and an edge region located adjacent to the first and second regions; and a light shielding region surrounding the transflective region, a transflective member disposed in the first, second and edge regions on a lower surface of the transparent substrate, where the transflective member has a different light transmittance in each of the first, second and edge regions, and a light shielding member disposed in the light shielding region on the lower surface of the transparent substrate, where the light shielding member defines an opening that exposes the transflective region. In such an embodiment, the light shielding member may include a long side extending in a first direction parallel to an upper surface of the transparent substrate, a short side extending in a second direction different from the first direction, and an intersection portion located in a portion where the long side crosses the short side. In such an embodiment, a light transmittance of the transflective member may gradually increase in a direction from an outside of the transflective member into an inside of the transflective member. In such an embodiment, the long side may be located adjacent to the first region, and the short side may be located adjacent to the second region. In such an embodiment, the intersection portion may be located adjacent to the edge region.

In an exemplary embodiment, a light transmittance of the first region may be greater than a light transmittance of the second region, and a light transmittance of the edge region may be less than the light transmittance of in the second region. In such an embodiment, the first photoresist pattern may overlap the transflective region and the light shielding region, and the recess of the first photoresist pattern may be formed through the transflective member located in the transflective region.

In an exemplary embodiment, the first photoresist pattern may include a first side portion corresponding to the long side, a second side portion corresponding to the short side, and an edge portion corresponding to the intersection portion. In such an embodiment, a slope of the recess adjacent to the first side portion may be steeper than a slope the recess adjacent to the second side portion, and a slope of the recess adjacent to the second side portion may be steeper than a slope of the recess adjacent to the edge portion.

In an exemplary embodiment, forming the first gate electrode pattern by performing the first etch process using the first photoresist pattern as the mask may include reducing a size of the first photoresist pattern by the first etch process. In such an embodiment, the first photoresist pattern having a reduced size may be defined as a second photoresist pattern.

In an exemplary embodiment, the method may further include performing a high concentration ion doping on the substrate after forming the first gate electrode pattern, and forming a first high concentration doping region and a second high concentration doping region in the active pattern.

In an exemplary embodiment, the method may further include forming a second gate electrode pattern by performing a second etch process using the second photoresist pattern as a mask, performing a low concentration doping on the substrate, and forming a first lower concentration doping region and a second low concentration doping region in the active pattern. In such an embodiment, the first and second high concentration doping regions may surround the first and second low concentration doping regions.

In an exemplary embodiment, the method may further include performing a post bake process in the first photoresist pattern after forming the first photoresist pattern.

According to exemplary embodiments of the invention, the photo mask includes the transflective member having a different light transmittance in each of the first region, the second region and the edge region, the photo mask may control the amount of photoresist to be reflowed in each of the first side portion, the second side portion and the edge portion of the photoresist pattern in a process for forming the photoresist pattern by using the photo mask. Accordingly, substantially the same taper angle may be obtained in the first side portion, the second side portion and the edge portion of the photoresist pattern after the post bake process.

According to exemplary embodiments of the invention, the photo mask includes the light shielding member having a different width in each of the long side, the short side and the edge portion, the photo mask may control the amount of photoresist to be reflowed in each of the first side portion, the second side portion, and the edge portion of the photoresist pattern in a process for forming the photoresist pattern by using the photo mask. Accordingly, substantially the same taper angle may be obtained in the first side portion, the second side portion, and the edge portion of the photoresist pattern after the post bake process.

In an exemplary embodiment of a method of manufacturing the semiconductor element using a photo mask, where the photo mask includes the transflective member having a different light transmittance in each of the first region, the second region and the edge region, the photo mask may control the amount of photoresist to be reflowed in each of the first side portion, the second side portion, and the edge portion of the first photoresist pattern in a process for forming the first photoresist pattern by using the photo mask. Accordingly, substantially the same taper angle may be obtained in the first side portion, the second side portion, and the edge portion of the first photoresist pattern after the post bake process. In such embodiments, a CD skew may be within a tolerance range, and the semiconductor element may be manufactured without any defect of the second gate electrode pattern.

BRIEF DESCRIPTION OF THE DRAWINGS

The above and other features of the invention will become more apparent by describing in further detail exemplary embodiments thereof with reference to the accompanying drawings, in which:

FIG. 5 is a bottom plan view of the photo mask showing a shielding member included in the photo mask of FIG. 4;

FIG. 7A is a cross-sectional view taken along line III-III' of FIG. 4;

FIG. 8A is a cross-sectional view taken along line IV-IV' of FIG. 4;

FIGS. 10 through 25 are cross-sectional views illustrating a method of manufacturing a semiconductor element using a photo mask in accordance with an exemplary embodiment.

DETAILED DESCRIPTION OF THE EMBODIMENTS

Figure 1:
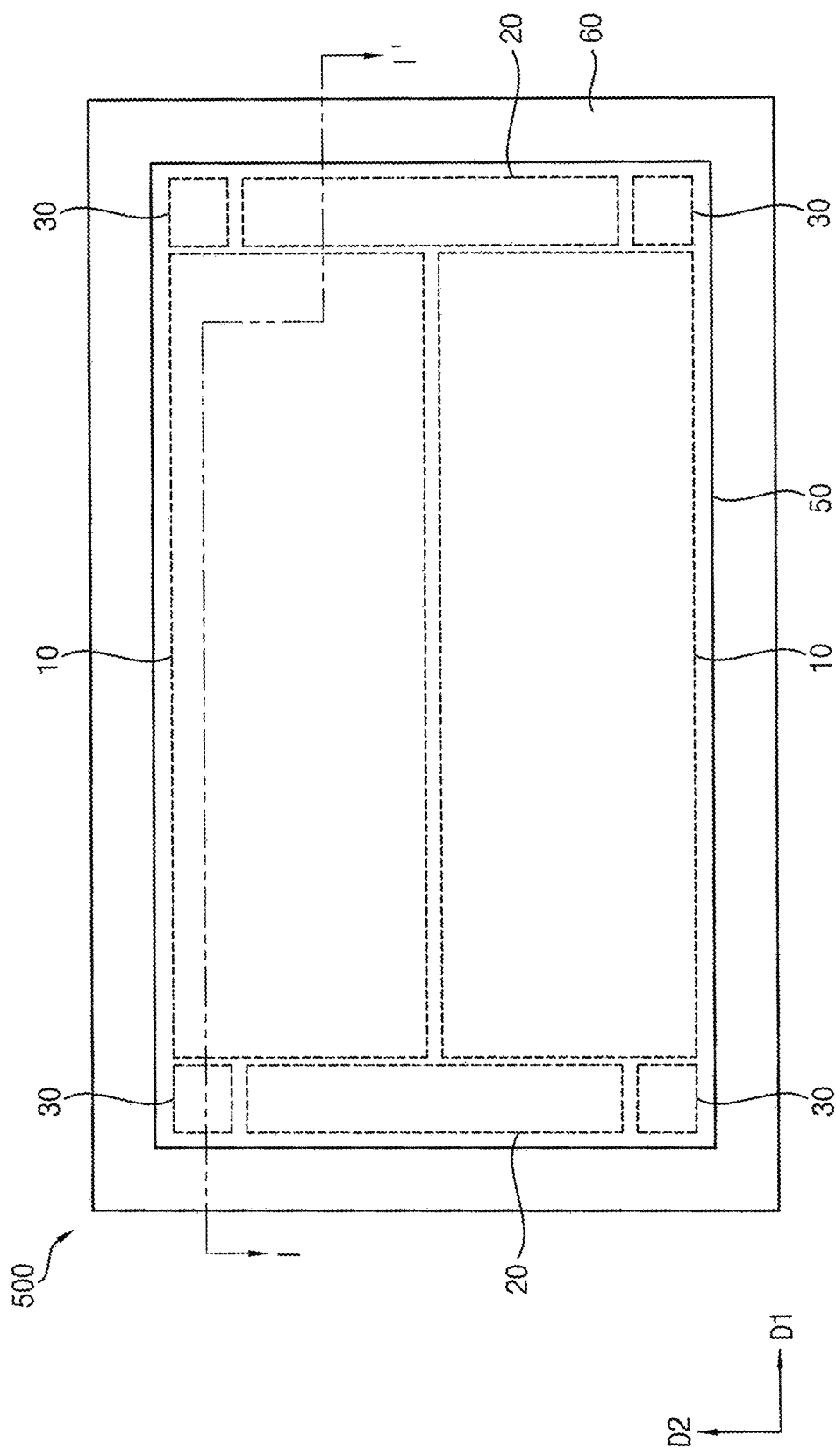
FIG. 1 is a top plan view of a photo mask in accordance with an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
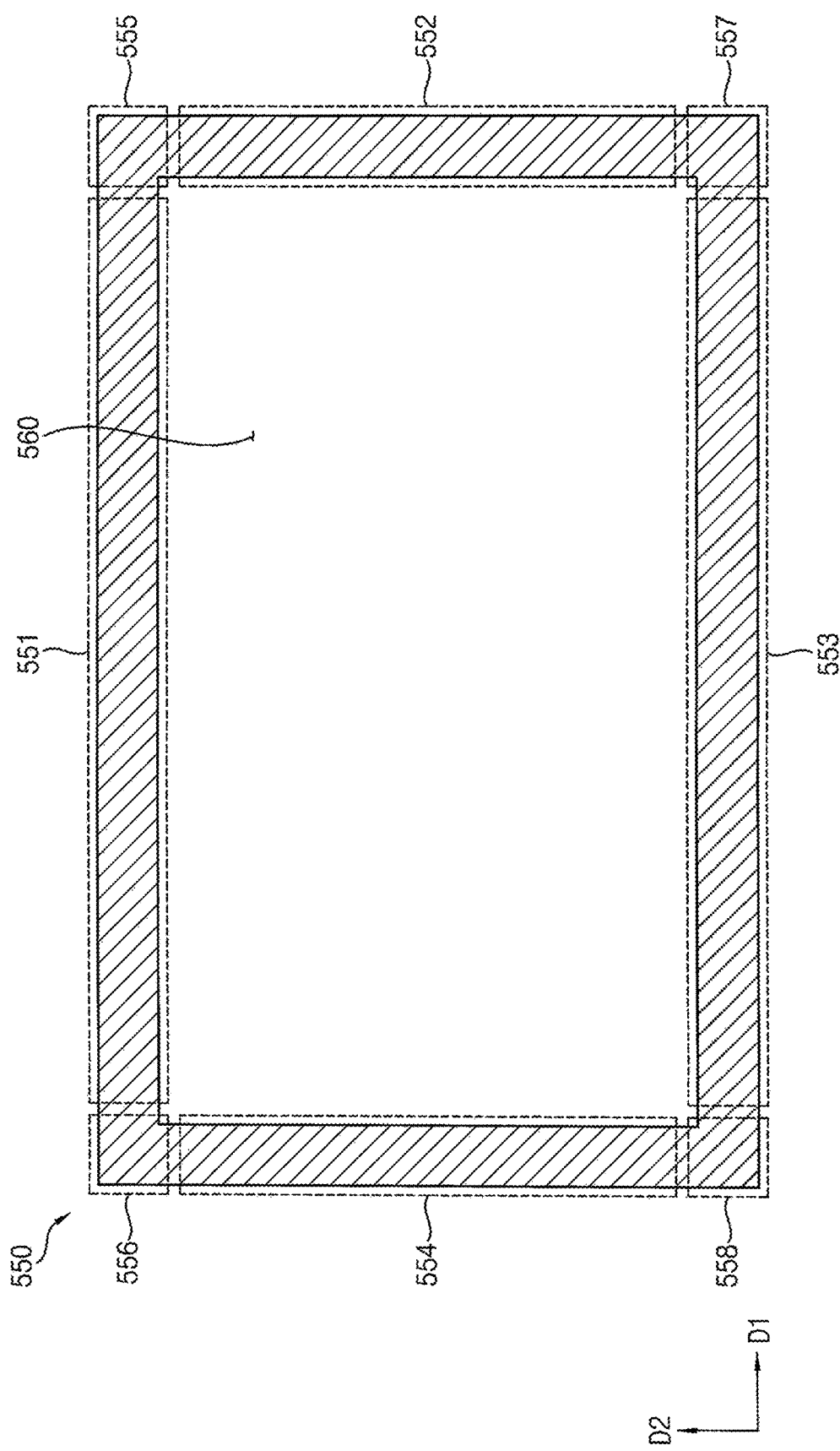
FIG. 2 is a bottom plan view of the photo mask illustrating a shielding member included in the photo mask of FIG. 1.
Figure 3A:
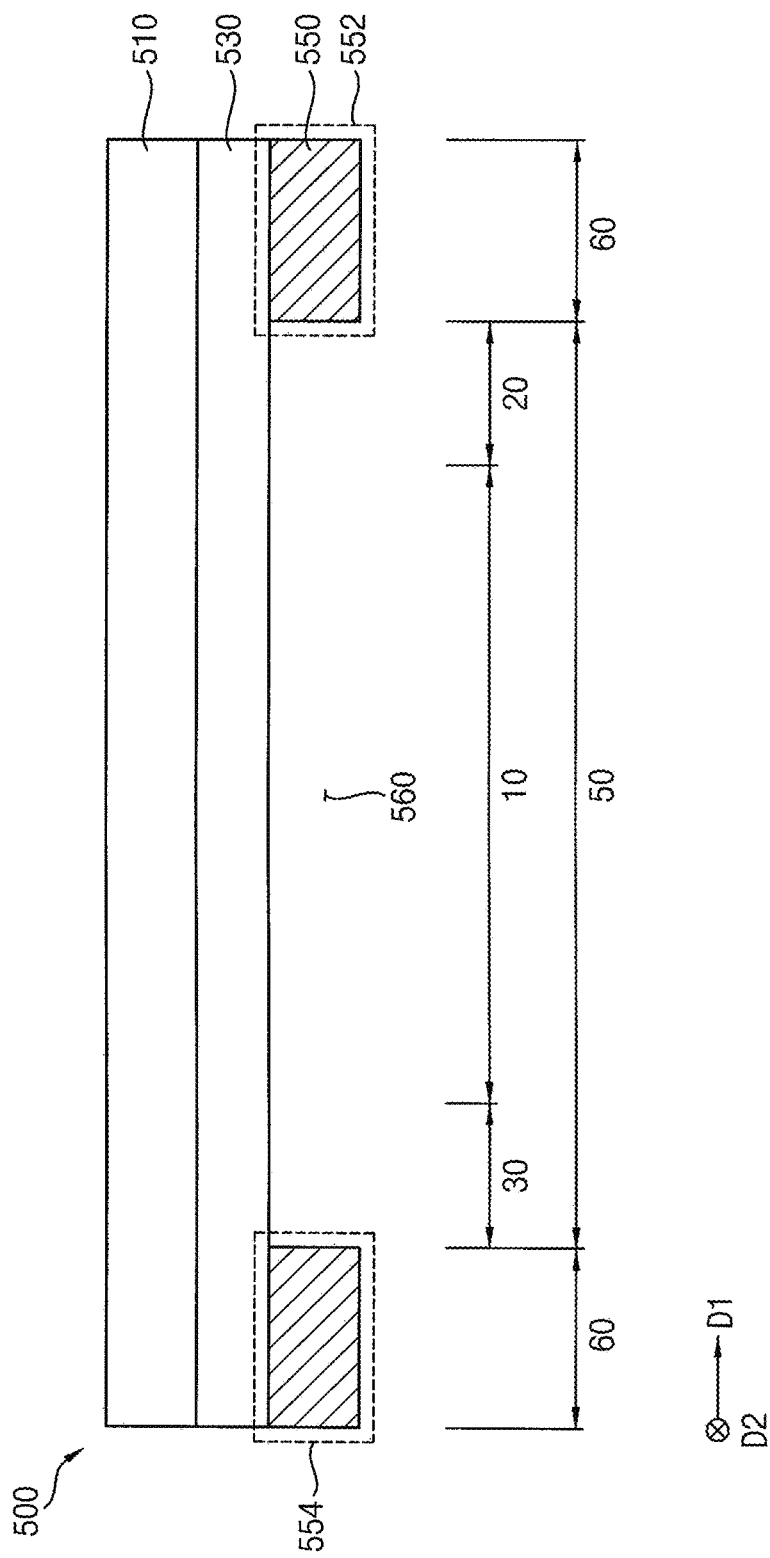
FIG. 3A is a cross-sectional view taken along line I-I' of FIG. 1.
Figure 3B:
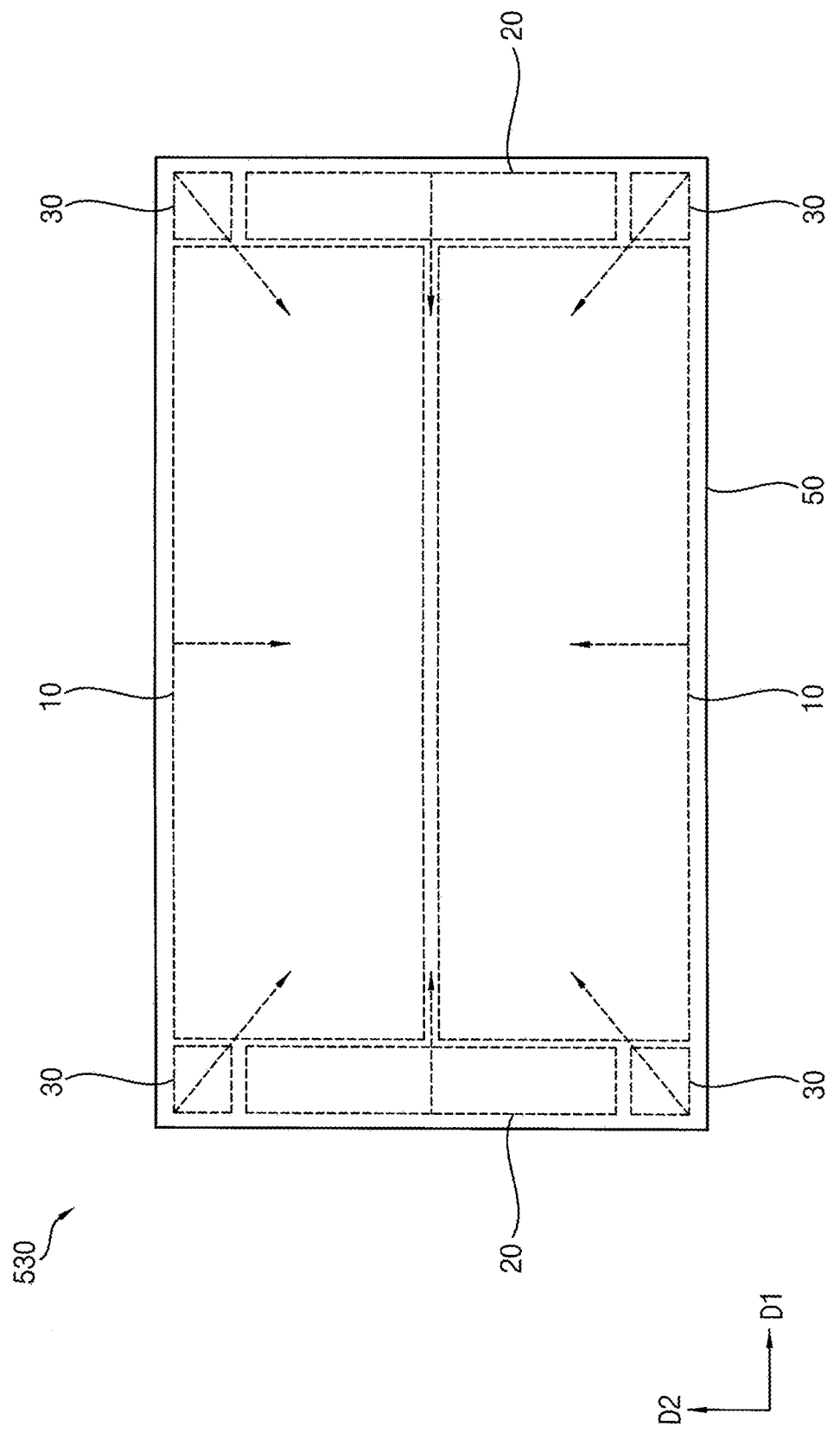
FIG. 3B is a plan view of a transflective member included in the photo mask of FIG. 1.
Figure 3C:
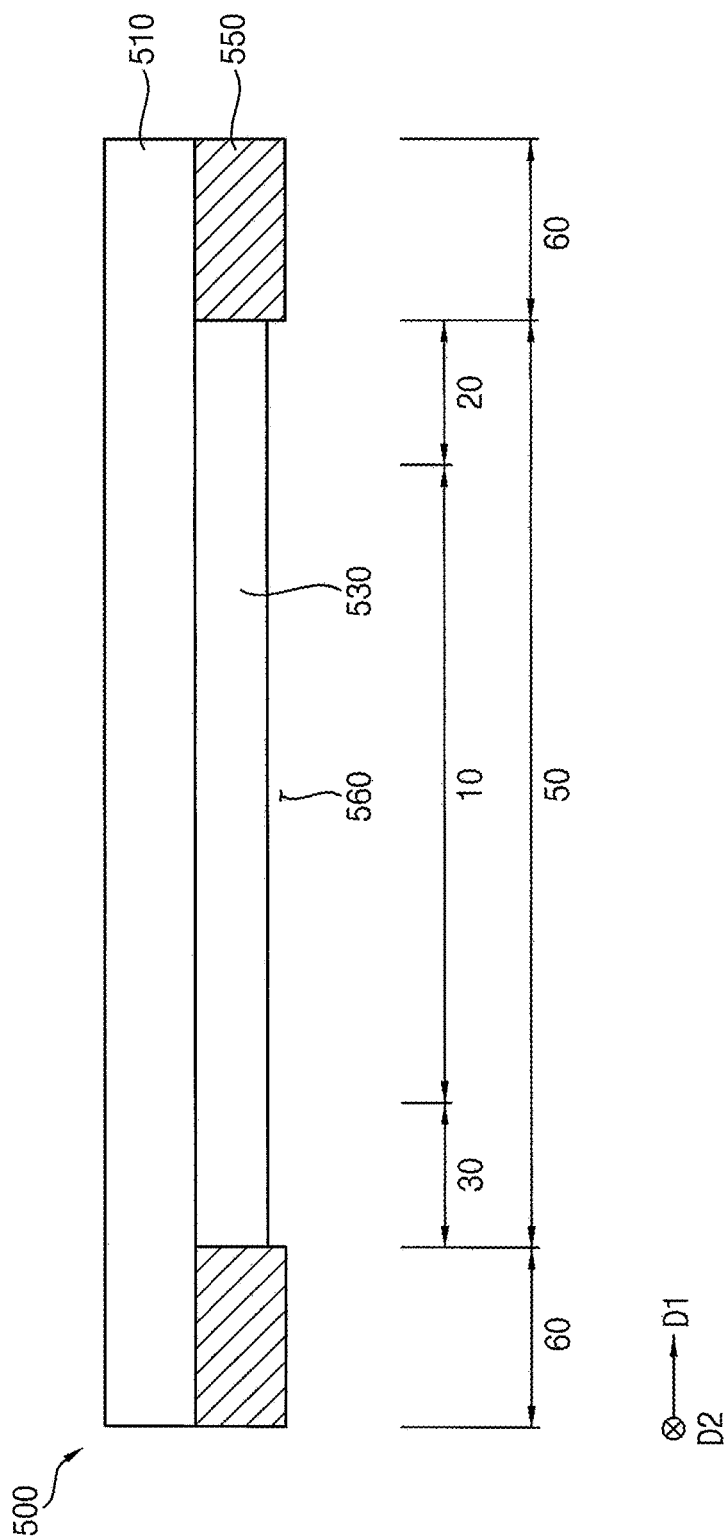
FIG. 3C is a cross-sectional view illustrating an alternative exemplary embodiment of the photo mask of FIG. 1.

FIG. 1 is a top plan view illustrating a photo mask in accordance with an exemplary embodiment, and FIG. 2 is a bottom plan view of the photo mask showing a shielding member included in the photo mask of FIG. 1. FIG. 3A is a cross-sectional view taken along line I-I' of FIG. 1, and FIG. 3B is a plan view of a transflective member included in the photo mask of FIG. 1. FIG. 3C is a cross-sectional view illustrating an exemplary alternative embodiment of the photo mask of FIG. 1.

Referring to FIGS. 1, 2, 3A and 3B, an exemplary embodiment of a photo mask 500 may include a transparent substrate 510, a transflective member 530 and a light shielding member 550.

In an exemplary embodiment, as illustrated in FIG. 1, the photo mask 500 may have a transflective region 50 and a light shielding region 60 surrounding the transflective region 50. In one exemplary embodiment, for example, the transflective region 50 may transmit a portion of a light, and may block a remaining portion of the light. In such an embodiment, the light shielding region 60 may block (or completely block) a light. In such an embodiment, the transflective region 50 may include a first region 10, a second region 20, and an edge region 30. In one exemplary embodiment, for example, the first region 10 may be located at a center in the transflective region 50, and the second region 20 may be located in opposing lateral portions of the first region 10. In such an embodiment, the edge region 30 may be located adjacent to the first and second regions 10 and 20. In an exemplary embodiment, as shown in FIG. 1, the first region 10 may be located adjacent to a long side of the transflective region 50, and the second region 20 may be located adjacent to a short side of the transflective region 50. In such an embodiment, the edge region 30 may be located adjacent to an edge portion of the transflective region 50.

In an exemplary embodiment, shapes of the light shielding region 60, the transflective region 50, the first region 10, the second region 20, and the edge region 30 illustrated in FIG. 1 have a plan shape of a rectangular shape, but not being limited thereto. In one alternative exemplary embodiment, for example, the shape of the light shielding region 60, the transflective region 50, the first region 10, the second region 20, and the edge region 30 may have a plan shape of a substantially triangular shape, a substantially diamond shape, a substantially polygonal shape, a substantially circular shape, a substantially athletic track shape, or a substantially elliptical shape, etc.

In an exemplary embodiment, as illustrated in FIG. 2, the light shielding member 550 may define an opening 560 that exposes the transflective region 50, and may have a long side, a short side, and an intersection portion. Here, the long side may extend in a first direction D1 that is parallel to an upper surface (e.g., a longitudinal direction of the upper surface) of the photo mask 500, and the short side may extend in a second direction D2 that is different from the first direction D1 (e.g., the second direction D2 may be perpendicular to the first direction D1). The intersection portion may be located in a portion where the long side crosses the short side. In such an embodiment, the long side may be located adjacent to the first region 10, and the short side may be located adjacent to second region 20. The intersection portion may be located adjacent to the edge region 30 (refer to FIG. 1). In such an embodiment, the long side may include a first long side 551 and a second long side 553, and the short side may include a first short side 552 and a second short side 554. The intersection portion may include a first intersection portion 555, a second intersection portion 556, a third intersection portion 557, and a fourth intersection portion 558. In one exemplary embodiment, for example, the first long side 551 may be located in the top of the first region 10, and the second long side 553 may be located in the bottom of the first region 10. The first long side 551 may face the second long side 553 to each other. In such an embodiment, the first long side 551 may be opposite to the second long side 553. In such an embodiment, each of the first short side 552 and the second short side 554 may be located adjacent to the second region 20, and the first short side 552 may face the second short side 554. In such an embodiment, the first intersection portion 555 may be located in a portion where the first long side 551 crosses the first short side 552, and the second intersection portion 556 may be located in a portion where the first long side 551 crosses the second short side 554. The third intersection portion 557 may be located in a portion where the second long side 553 crosses the first short side 552, and the fourth intersection portion 558 may be located in a portion where the second long side 553 crosses the second short side 554.

In an exemplary embodiment, as illustrated in FIG. 3A, the transflective member 530 and the light shielding member 550 may be disposed on a lower surface of the transparent substrate 510.

The transparent substrate 510 may include a transparent material that transmits a light. In such an embodiment, as the photo mask 500 has the transflective region 50 and the light shielding region 60, the transparent substrate 510 may be divided into the transflective region 50 and the light shielding region 60. The transparent substrate 510 may include a quartz substrate, a synthetic quartz substrate, a calcium fluoride substrate, a fluoride-doped quartz substrate, a sodalime glass substrate or a non-alkali glass substrate, for example.

In an exemplary embodiment, as shown in FIG. 3A, the transflective member 530 may be disposed on an entire portion of the lower surface of the transparent substrate 510. In such an embodiment, the transflective member 530 may be disposed to overlap the first region 10, the second region 20, and the edge region 30 on the lower surface of the transparent substrate 510. In an exemplary embodiment, the transflective member 530 may transmit a portion of a light, and may block a remaining portion of the light. In such an embodiment, the transflective member 530 may selectively transmit a light. In such an embodiment, the transflective member 530 may have a different light transmittance in each of the first region 10, the second region 20, and the edge region 30, and a light transmittance of the transflective member 530 may be gradually increased in a direction from an outside the transflective member 530 into an inside of the transflective member 530. In an exemplary embodiment, as illustrated in FIG. 3B, the light transmittance of the transflective member 530 may be gradually increased in a direction of an arrow from each of the first region 10, the second region 20, and the edge region 30 toward the center of the transflective member 530. In such an embodiment, where the transflective member 530 has the different light transmittance in each of the first region 10, the second region 20, and the edge region 30, a recess may be formed in an upper surface of the photoresist pattern in a process for forming a photoresist pattern using the photo mask 500.

Referring again to FIGS. 1, 3A and 3B, in an exemplary embodiment, a light transmittance of the transflective member 530 that is located in the first region 10 may be greater than a light transmittance of the transflective member 530 that is located in the second region 20, and a light transmittance of the transflective member 530 that is located in the edge region 30 may be less than the transmittance of the transflective member 530 that is located in the second region 20. In such an embodiment, a light transmittance of the transflective member 530 may be decreased in the order of the first region 10, the second region 20, and the edge region 30.

As described above, when an electrode pattern is formed using a conventional photo mask, a post bake process may be performed in a photoresist pattern after the photoresist pattern is formed on a preliminary electrode layer. When the post bake process is performed, a reflow phenomenon may occur in an outer portion of the photoresist pattern, and the amount of photoresist to be reflowed may be different according to a shape of the outer portion of the photoresist pattern (e.g., a relatively large amount of a photoresist or a sufficient thickness of the photoresist pattern is required since two etch processes are performed to form a high concentration doping region (or a heavily doped region) and a low concentration doping region (or a lightly doped region) when a semiconductor device having a light doped drain ("LDD") structure is formed.). In other words, when the photoresist pattern has a plan shape of a rectangular shape, a first side portion (e.g., corresponding to the first region 10), a second side portion (e.g., corresponding to the second region 20), and an edge portion (e.g., corresponding to the edge region 30) may be defined in the photoresist pattern. In this case, the amount of the photoresist to be reflowed in the first side portion may be greater than the amount of the photoresist to be reflowed in the second side portion, and the amount of the photoresist to be reflowed in the second side portion may be greater than the amount of the photoresist to be reflowed in the edge portion. Since the amount of the photoresist that is located in the first side portion is greater than the amount of the photoresist that is located in the second side portion, the amount of the photoresist to be reflowed in the first side portion may be relatively large. In addition, since the amount of the photoresist that is located in the edge portion is less than the amount of the photoresist that is located in the second side portion, the amount of the photoresist to be reflowed in the edge portion may be relatively small. That is, the amount of the photoresist to be reflowed in each of the fist side portion, the second side portion, and the edge portion may be different. In this case, a critical dimension ("CD") skew, which is the difference between an after develop inspection ("ADI") CD of the photoresist pattern and an after cleaning inspection ("ACI") CD of the electrode pattern, may be out of a tolerance range, and a defect of the electrode pattern may occur.

In an exemplary embodiment, when an electrode pattern is formed using the photo mask 500, the amount of photoresist to be reflowed may be substantially the same according to a shape of an outer portion of the photoresist pattern although the post bake process is performed. In one exemplary embodiment, for example, a photoresist pattern having a plan shape of a rectangular shape may be formed by irradiating ultraviolet ("UV") on the photo mask 500. In such an embodiment, since the photo mask 500 includes the transflective member 530, a recess may be formed in an upper surface of the photoresist pattern.

In an exemplary embodiment, a light transmittance of the transflective member 530 located in the first region 10 of the photo mask 500 corresponding to the first side portion of the photoresist pattern may be greater than a light transmittance of the transflective member 530 located in the second region 20 of the photo mask 500 corresponding to the second side portion of the photoresist pattern, and a slope of the recess located in the first side portion of the photoresist pattern may be steeper than a slope of the recess located in the second side portion of the photoresist pattern. In such an embodiment, a light transmittance of the transflective member 530 located in the second region 20 of the photo mask 500 corresponding to the second side portion of the photoresist pattern may be greater than a light transmittance of the transflective member 530 located in the edge region 30 of the photo mask 500 corresponding to the edge portion of the photoresist pattern, and a slope of the recess located in the second side portion of the photoresist pattern may be steeper than a slope of the recess located in the edge portion of the photoresist pattern. In such an embodiment, a light transmittance of the transflective member 530 located in the edge region 30 of the photo mask 500 corresponding to the edge portion of the photoresist pattern may be less than a light transmittance of the transflective member 530 located in the first and second regions 10 and 20 of the photo mask 500 corresponding to each of the first and second side portions of the photoresist pattern, and a slope of the recess located in the edge portion of the photoresist pattern may be more gradual or gentle (or less steeper) than a slope of the recess located in each of the first and second side portions of the photoresist pattern.

In such an embodiment, as described above, the amount of photoresist located in the first side portion, the second side portion, and the edge portion of the photoresist pattern may be controlled using the photo mask 500. In such an embodiment, since a slope of the recess of the photoresist pattern is relatively steep in the first side portion of the photoresist pattern, a relatively small amount of photoresist may be located in the first side portion of the photoresist pattern, and the amount of photoresist to be reflowed may be relatively reduced. In such an embodiment, since a slope of the recess of the photoresist pattern is relatively gradual in the edge portion of the photoresist pattern, a relatively large amount of photoresist may be located in the edge portion of the photoresist pattern, and the amount of photoresist to be reflowed may be relatively increased. Thus, in such an embodiment, a substantially same taper angle may be obtained in the first side portion, the second side portion, and the edge portion of the photoresist pattern after the post bake process since the amount of photoresist to be reflowed in each of the first side portion, the second side portion, and the edge portion of the photoresist pattern by using the photo mask 500 is controlled. Accordingly, the CD skew may be within a tolerance range, and a defect of the electrode pattern may be effectively prevented.

In an exemplary embodiment, the transflective member 530 may include molybdenum silicide (MoSi), molybdenum silicide nitride (MoSiN), molybdenum silicide carbonitride (MoSiCN), molybdenum silicide oxynitride (MoSiON) or molybdenum silicide carboxynitride (MoSiCON), for example. In one exemplary embodiment, for example, where the transflective member 530 includes MoSiON, a light transmittance may be controlled by appropriately adjusting the composition ratio of silicon (Si), oxygen (O), and nitrogen (N).

The light shielding member 550 may be disposed in the light shielding region 60 on a lower surface of the transparent substrate 510. The light shielding member 550 may block a light. In one exemplary embodiment, for example, in a process for forming a photoresist pattern, since UV may not be irradiated in a first portion that corresponds to the light shielding member 550, the photoresist pattern may be formed in the first portion. Otherwise, since UV may be irradiated in a second portion where the light shielding member 550 is not located, the photoresist pattern may be removed in the second portion (e.g., a positive type photoresist).

In an exemplary embodiment, as described above, the light shielding member 550 may define the opening 560 that exposes the transflective region 50, and may include the first long side 551, the second long side 553, the first short side 552, the second short side 554, the first intersection portion 555, the second intersection portion 556, the third intersection portion 557 and the fourth intersection portion 558. A cross-sectional view of the light shielding member 550 illustrated in FIG. 3A may correspond to the second short side 554 and the first short side 552. The light shielding member 550 may include titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), tungsten (W), silicon (Si), or a combination thereof, for example.

In an alternative exemplary embodiment, as illustrated in FIG. 3C, the transflective member 530 may be disposed only in the transflective region 50. In such an embodiment, the transflective member 530 may be disposed in the opening 560 of the light shielding member 550. In such an embodiment, the light shielding member 550 may be in direct contact with a lower surface of the transparent substrate 510.

In an exemplary embodiment, the photo mask 500 includes the transflective member 530 having a different light transmittance in each of the first region 10, the second region 20, and the edge region 30, such that the photo mask 500 may control the amount of photoresist to be reflowed in each of the first side portion, the second side portion, and the edge portion of the photoresist pattern in a process for forming the photoresist pattern by using the photo mask 500. Accordingly, in such an embodiment, substantially the same taper angle may be obtained in the first side portion, the second side portion, and the edge portion of the photoresist pattern after the post bake process.

Figure 4:
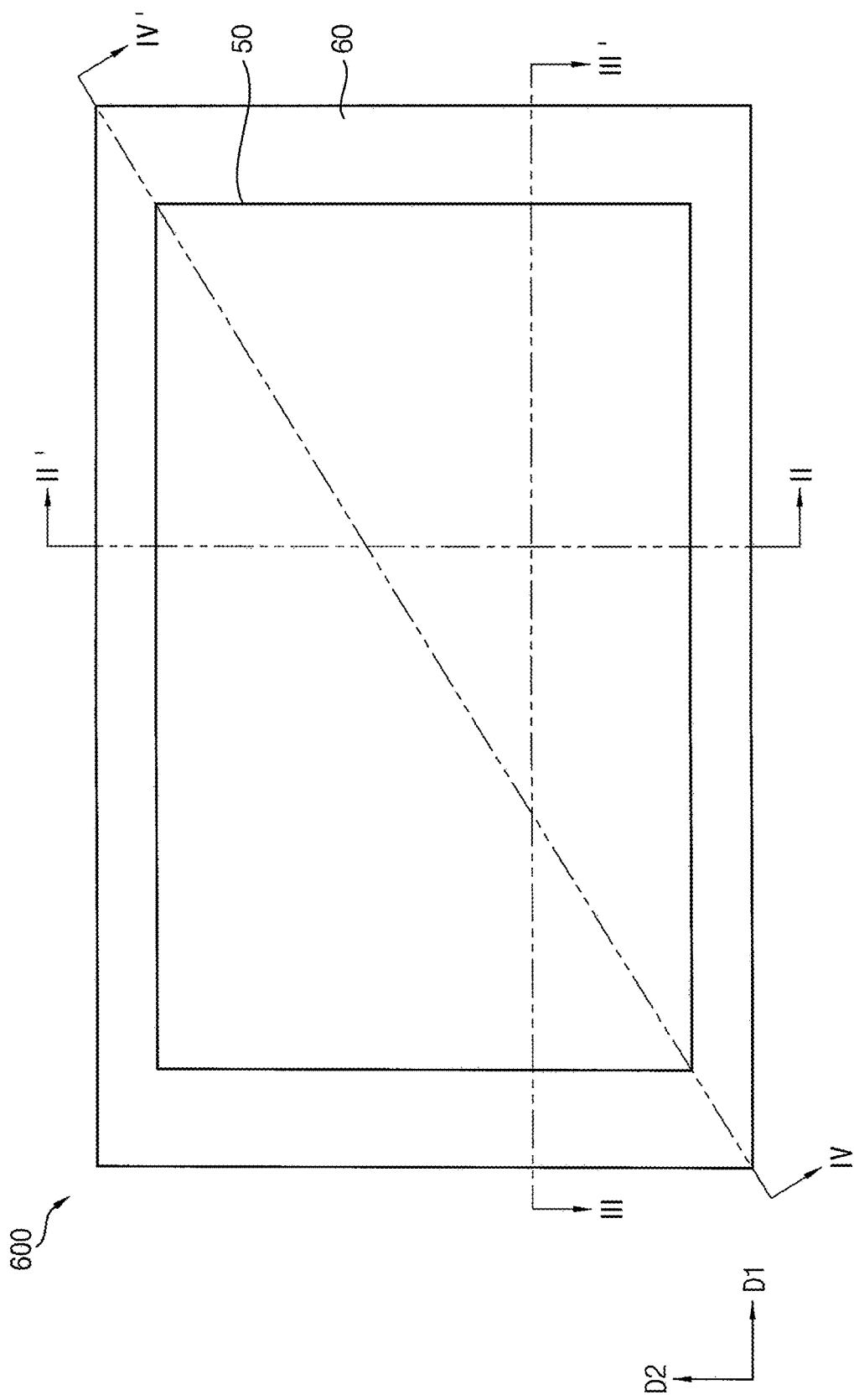
FIG. 4 is a top plan view of a photo mask in accordance with an alternative exemplary embodiment.
Figure 6A:
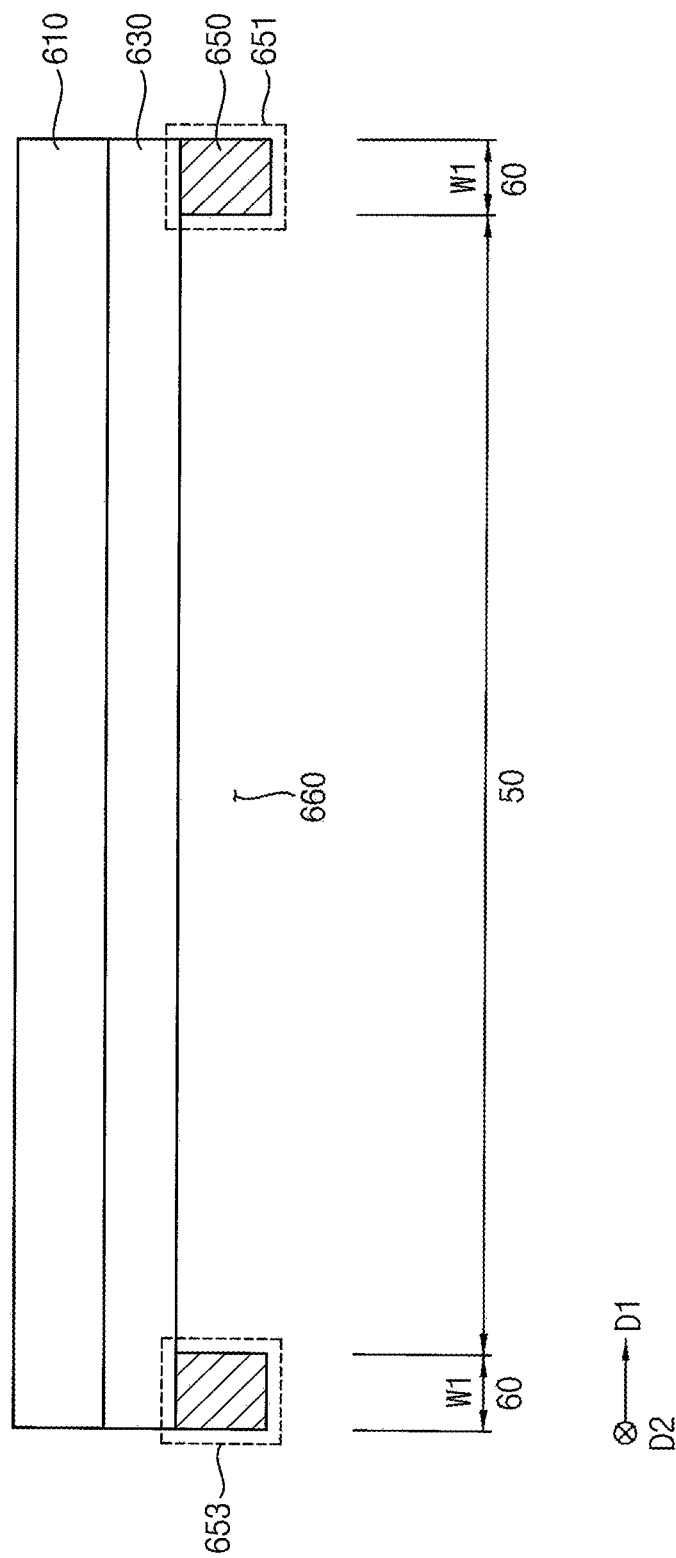
FIG. 6A is a cross-sectional view taken along line II-II' of FIG. 4.
Figure 6B:
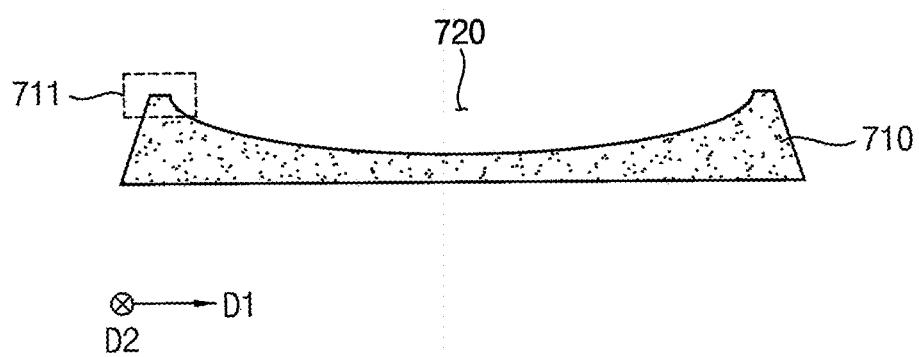
FIG. 6B is a cross-sectional view of a first photoresist pattern formed using the photo mask of FIG. 4.
Figure 7B:
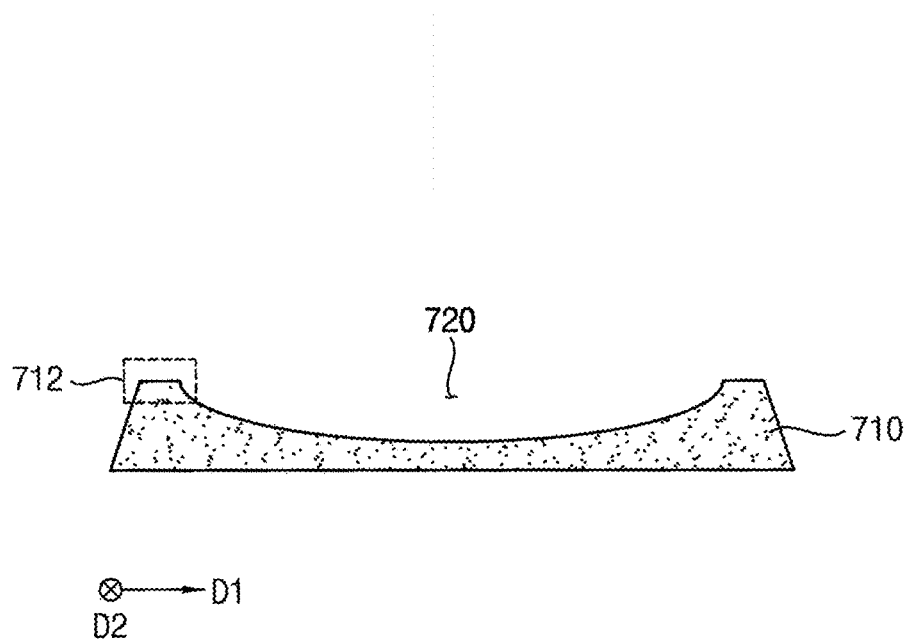
FIG. 7B is a cross-sectional view of a second photoresist pattern formed using the photo mask of FIG. 4.
Figure 8B:
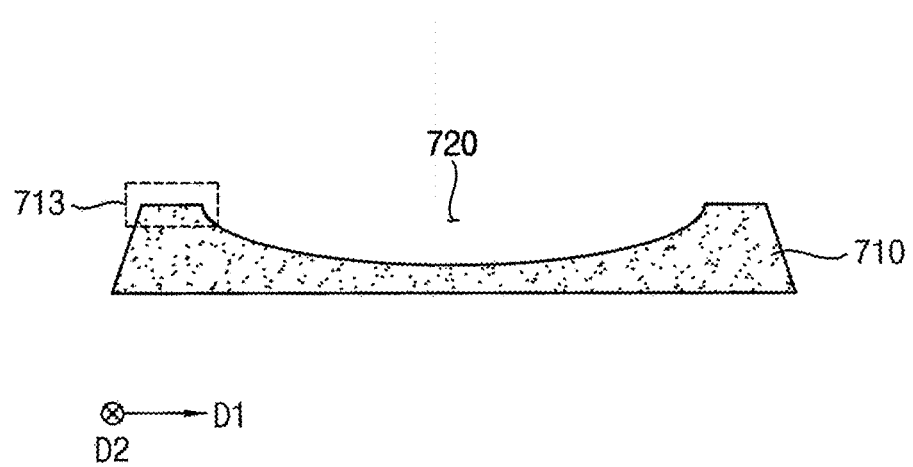
FIG. 8B is a cross-sectional view of a third photoresist pattern formed using the photo mask of FIG. 4.

FIG. 4 is a top plan view of a photo mask in accordance with an alternative exemplary embodiment, and FIG. 5 is a bottom plan view of the photo mask showing a shielding member included in the photo mask of FIG. 4. FIG. 6A is a cross-sectional view taken along line II-II' of FIG. 4, and FIG. 6B is a cross-sectional view of a first photoresist pattern formed using the photo mask of FIG. 4. FIG. 7A is a cross-sectional view taken along line III-III' of FIG. 4, and FIG. 7B is a cross-sectional view of a second photoresist pattern formed using the photo mask of FIG. 4. FIG. 8A is a cross-sectional view taken along line IV-IV' of FIG. 4, and FIG. 8B is a cross-sectional view of a third photoresist pattern formed using the photo mask of FIG. 4.

Referring to FIGS. 4, 5, 6A, 6B, 7A, 7B, 8A and 8B, an exemplary embodiment of a photo mask 600 may include a transparent substrate 610, a transflective member 630 and a light shielding member 650.

In such an embodiment, as illustrated in FIG. 4, the photo mask 600 may have a transflective region 50 and a light shielding region 60 surrounding the transflective region 50. In one exemplary embodiment, for example, the transflective region 50 may transmit a portion of a light, and may block a remaining portion of the light. In addition, the light shielding region 60 may block a light. In an exemplary embodiment, the light shielding region 60 may include a long side and a short side, and a width of the long side may be different from a width of the short side.

In such an embodiment, as illustrated in FIG. 5, the light shielding member 650 may define an opening 660 that exposes the transflective region 50, may have a long side, a short side, and an intersection portion. Here, the long side of the light shielding member 650 may extend in a first direction D1 that is parallel to an upper surface (e.g., a longitudinal direction of the upper surface) of the photo mask 600, and the short side of the light shielding member 650 may extend in a second direction D2 that is different from the first direction D1 (e.g., the second direction D2 may be perpendicular to the first direction D1). The intersection portion may be located in a portion where the long side crosses the short side. In an exemplary embodiment, a first width W1 in a direction (or extending in a second direction D2) of the long side of the light shielding member 650 may be less than a second width W2 in the direction (or extending in a first direction D1) of the short side of the light shielding member 650. In such an embodiment, a third width W3 extending in a diagonal direction (or a direction that is different from the first and second directions D1 and D2) of the intersection portion of the light shielding member 650 may be greater than the second width W2 extending in the direction of the short side of the light shielding member 650. Here, the direction may be from the outside of the light shielding member 650 toward the inside of the light shielding member 650.

The long side having the first width W1 may include a first long side 651 and a second long side 653, and the short side having the second width W2 may include a first short side 652 and a second short side 654. The intersection portion having the third width W3 may include a first intersection portion 655, a second intersection portion 656, a third intersection portion 657, and a fourth intersection portion 658. In one exemplary embodiment, for example, the first long side 651 may be located in the top of the transflective region 50, and the second long side 653 may be located in the bottom of the transflective region 50. The first long side 651 may face the second long side 653 to each other. In such an embodiment, the first long side 651 may be opposite to the second long side 653. In such an embodiment, each of the first short side 652 and the second short side 654 may be located adjacent to the transflective region 50, and the first short side 652 may face the second short side 654. In such an embodiment, the first intersection portion 655 may be located in a portion where the first long side 651 crosses the first short side 652, and the second intersection portion 656 may be located in a portion where the first long side 651 crosses the second short side 654. The third intersection portion 657 may be located in a portion where the second long side 653 crosses the first short side 652, and the fourth intersection portion 658 may be located in a portion where the second long side 653 crosses the second short side 654.

In such an embodiment, the light shielding member 650 having a different width in each of the long side, the short side and the edge portion may be defined as illustrated in FIGS. 6A, 7A, and 8A since the light shielding member 650 includes the first and second long sides 651 and 652 having the first width W1, the first and second short sides 652 and 654 having the second width W2, and the first, second, third and fourth intersection portions 655, 656, 657 and 658 having the third width W3.

In an exemplary embodiment, in a process for forming a photoresist pattern 710 by using the photo mask 600 including the light shielding member 650 having the different widths in the long side, the short side, and the edge portion as illustrated in FIGS. 6B, 7B and 8B, crest portions 711, 712, and 713 to be formed in opposing lateral portions of a recess 720 may have different lengths from each other when formed in an upper surface of the photoresist pattern 710.

When an electrode pattern is formed using a conventional photo mask, a post bake process may be performed in a photoresist pattern after the photoresist pattern is formed on a preliminary electrode layer. When the post bake process is performed, a reflow phenomenon may be generated in an outer portion of the photoresist pattern, and the amount of photoresist to be reflowed may be different according to a shape of the outer portion of the photoresist pattern. In other words, when the photoresist pattern has a plan shape of a rectangular shape, a first side portion (e.g., corresponding to the long side), a second side portion (e.g., corresponding to the short side), and an edge portion (e.g., corresponding to the intersection portion) may be defined in the photoresist pattern. In this case, the amount of the photoresist to be reflowed in the first side portion may be greater than the amount of the photoresist to be reflowed in the second side portion, and the amount of the photoresist to be reflowed in the second side portion may be greater than the amount of the photoresist to be reflowed in the edge portion. Since the amount of the photoresist that is located in the first side portion is greater than the amount of the photoresist that is located in the second side portion, the amount of the photoresist to be reflowed in the first side portion may be relatively large. In addition, since the amount of the photoresist that is located in the edge portion is less than the amount of the photoresist that is located in the second side portion, the amount of the photoresist to be reflowed in the edge portion may be relatively small. That is, the amount of the photoresist to be reflowed in each of the fist side portion, the second side portion, and the edge portion may be different. In this case, a CD skew, which is the difference between an ADI CD of the photoresist pattern and an ACI CD of the electrode pattern, may be out of a tolerance range, and a defect of the electrode pattern may occur.

In an exemplary embodiment, when an electrode pattern is formed using the photo mask 600, the amount of photoresist to be reflowed may be substantially the same according to a shape of an outer portion of the photoresist pattern although the post bake process is performed. In one exemplary embodiment, for example, a photoresist pattern having a plan shape of a rectangular shape may be formed by irradiating UV on the photo mask 600. In such an embodiment, since the photo mask 600 includes the transflective member 630, the recess 720 may be formed in an upper surface of the photoresist pattern.

In an exemplary embodiment, as illustrated in FIG. 6A, the first and second long sides 651 and 653 of the light shielding member 650 included in the photo mask 600 corresponding to the first side portion of the photoresist pattern may have the first width W1 greater than the second width W2. In such an embodiment, as illustrated in FIG. 6B, a length of the crest portion 711 (or a distance of an upper surface of the crest portion 711) formed in opposing lateral portions of the recess 720 located in the first side portion of the photoresist pattern 710 may be less than a length of the crest portion 712 (or a distance of an upper surface of the crest portion 712) formed in opposing lateral portions of the recess 720 located in the second side portion of the photoresist pattern 710. In such an embodiment, as illustrated in FIG. 7A, the first and second short sides 652 and 654 of the light shielding member 650 included in the photo mask 600 corresponding to the second side portion of the photoresist pattern may have the second width W2 less than the third width W3. In such an embodiment, as illustrated in FIG. 7B, a length of the crest portion 712 (or a distance of an upper surface of the crest portion 712) formed in opposing lateral portions of the recess 720 located in the second side portion of the photoresist pattern 710 may be less than a length of the crest portion 713 (or a distance of an upper surface of the crest portion 713) formed in opposing lateral portions of the recess 720 located in the edge portion of the photoresist pattern 710. In such an embodiment, as illustrated in FIG. 8A, the first, second, third, and fourth intersection portions 655, 656, 657 and 658 of the light shielding member 650 included in the photo mask 600 corresponding to the edge portion of the photoresist pattern may have the third width W3 greater than the first and second widths W1 and W2. In such an embodiment, as illustrated in FIG. 8B, a length of the crest portion 713 (or a distance of an upper surface of the crest portion 713) formed in opposing lateral portions of the recess 720 located in the edge portion of the photoresist pattern 710 may be greater than a length of the crest portions 711 and 712 (or a distance of an upper surface of the crest portions 711, and 712) formed in opposing lateral portions of the recess 720 located in each of the first and second side portions of the photoresist pattern 710.

In an exemplary embodiment, as described above, the amount of photoresist located in the first side portion, the second side portion, and the edge portion of the photoresist pattern 710 may be controlled using the photo mask 600. In an exemplary embodiment, where the length of the crest portion 711 formed in opposing lateral portions of the recess 720 of the photoresist pattern 710 is relatively small in the first side portion of the photoresist pattern 710, a relatively small amount of photoresist may be located, and the amount of photoresist to be reflowed may be relatively reduced. In such an embodiment, since the length of crest portion 713 formed in opposing lateral portions of the recess 720 of the photoresist pattern 710 is relatively large in the edge portion of the photoresist pattern 710, a relatively large amount of photoresist may be located, and the amount of photoresist to be reflowed may be relatively increased. Thus, as the amount of photoresist to be reflowed in each of the first side portion, the second side portion, and the edge portion of the photoresist pattern 710 by using the photo mask 600 is controlled, a substantially same taper angle may be obtained in the first side portion, the second side portion, and the edge portion of the photoresist pattern 710 after the post bake process.

Accordingly, the CD skew may be within a tolerance range, and a defect of the electrode pattern may be effectively prevented.

The transparent substrate 610 may include a transparent material that transmits a light. In such an embodiment, as the photo mask 600 has the transflective region 50 and the light shielding region 60, the transparent substrate 610 may be divided into the transflective region 50 and the light shielding region 60. The transparent substrate 610 may include a quartz substrate, a synthetic quartz substrate, a calcium fluoride substrate, a fluoride-doped quartz substrate, a sodalime glass substrate or a non-alkali glass substrate, for example.

The transflective member 630 may be disposed on an entire portion of a lower surface of the transparent substrate 610. In such an embodiment, the transflective member 630 may be disposed in the transflective region 50 and the light shielding region 60 on the lower surface of the transparent substrate 610. In an exemplary embodiment, the transflective member 630 may transmit a portion of a light, and may block a remaining portion of the light. In such an embodiment, the transflective member 630 may selectively transmit a light. In such an embodiment, a light transmittance of the transflective member 630 may be gradually increased in a direction from the outside the transflective member 630 into the inside of the transflective member 630.

The transflective member 630 may include MoSi, MoSiN, MoSiCN, MoSiON, MoSiCON, etc. In one exemplary embodiment, for example, when the transflective member 630 includes MoSiON, a light transmittance may be controlled by appropriately adjusting the composition ratio of Si, O and N.

The light shielding member 650 may be disposed in the light shielding region 60 on a lower surface of the transparent substrate 610. The light shielding member 650 may block a light. In one exemplary embodiment, for example, in a process for forming a photoresist pattern, the photoresist pattern may be formed in the first portion since UV may not be irradiated in a fist portion that corresponds to the light shielding member 650. In such an embodiment, the photoresist pattern may be removed in the second portion (e.g., a positive type photoresist) since UV may be irradiated in a second portion where the light shielding member 650 is not located.

In an exemplary embodiment, as described above, the light shielding member 650 may define the opening 660 that exposes the transflective region 50, and may include the first and second long sides 651 and 653 having the first width W1, the first and second short sides 652 and 654 having the second width W2, and the first, second, third and fourth intersection portions 655, 656, 657 and 658 having the third width W3. A cross-sectional view of the light shielding member 650 illustrated in FIG. 6A may correspond to the second long side 653 and the first long side 651, and a cross-sectional view of the light shielding member 650 illustrated in FIG. 7A may correspond to the second short side 654 and the first short side 652. A cross-sectional view of the light shielding member 650 illustrated in FIG. 8A may correspond to the fourth intersection portion 658 and the fist intersection portion 655. The light shielding member 650 may include Ti, V, Co, Ni, Zr, Nb, Pd, Zn, Cr, Mn, Al, Mn, Cd, Mg, Li, Se, Cu, Mo, Hf, Ta, W, Si, or a combination thereof.

In an alternative exemplary embodiment, the transflective member 630 may be disposed only in the transflective region 50. In In such an embodiment, the transflective member 630 may be disposed in the opening 660 of the light shielding member 650. In such an embodiment, the light shielding member 650 may be in direct contact with a lower surface of the transparent substrate 510.

In an exemplary embodiment, the photo mask 600 includes the light shielding member 650 having a different width in each of the long side, the short side and the edge portion, such that the photo mask 600 may control the amount of photoresist to be reflowed in each of the first side portion, the second side portion, and the edge portion of the photoresist pattern in a process for forming the photoresist pattern by using the photo mask 600. Accordingly, substantially the same taper angle may be obtained in the first side portion, the second side portion, and the edge portion of the photoresist pattern after the post bake process.

Figure 9:
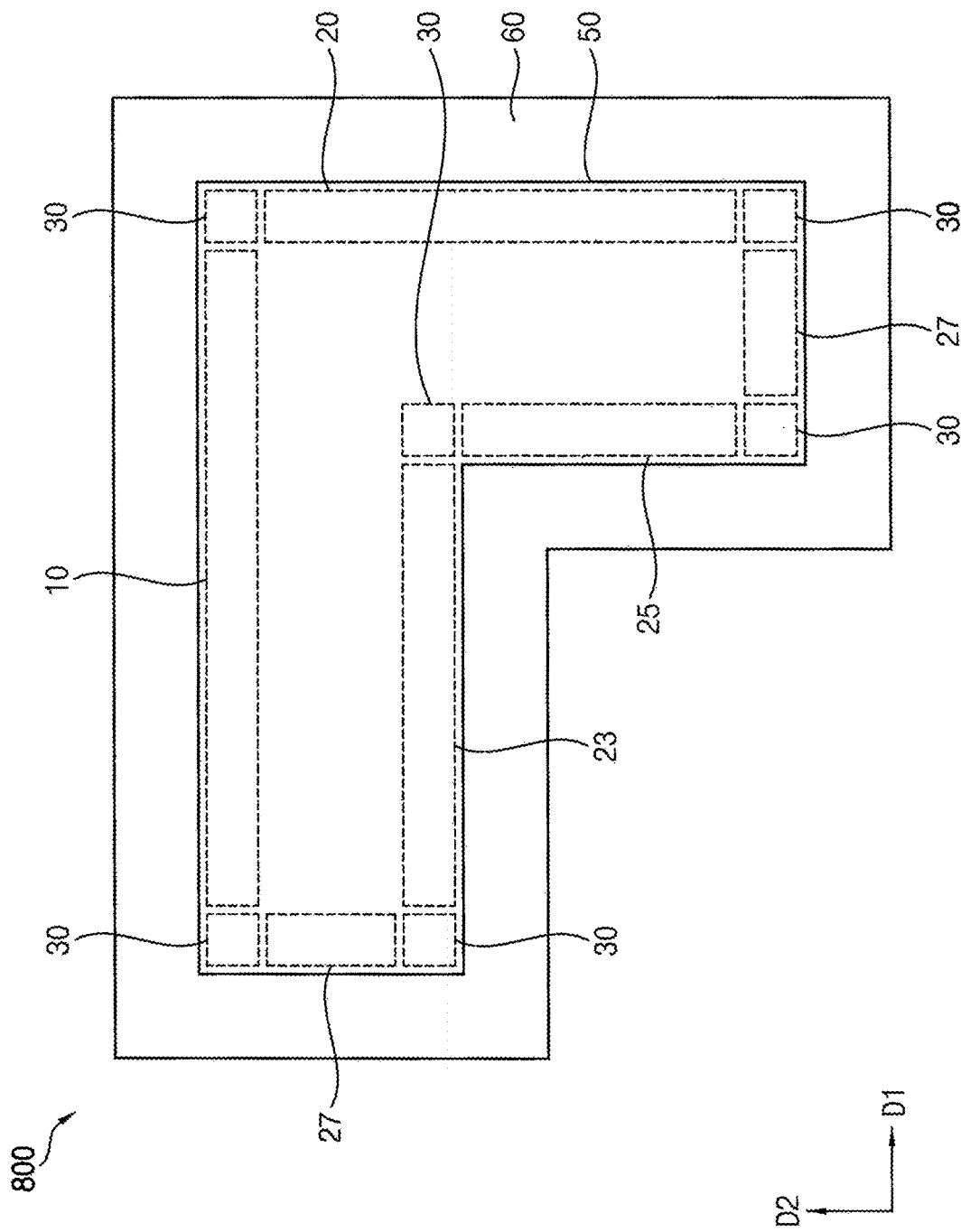
FIG. 9 is a plan view of a photo mask in accordance with another alternative exemplary embodiment.

FIG. 9 is a plan view of a photo mask in accordance with another alternative exemplary embodiment. A photo mask 800 illustrated in FIG. 9 may be substantially the same as or similar to a photo mask described above with reference to FIGS. 1 through 3C except a plan shape of the photo mask 800. The same or like elements shown in FIG. 9 have been labeled with the same reference characters as used above to describe the exemplary embodiments of the photo mask shown in FIGS. 1 through 3C, and any repetitive detailed description thereof will hereinafter be omitted or simplified.

Referring to FIG. 9, an exemplary embodiment of a photo mask 800 may include a transparent substrate, a transflective member and a light shielding member. In an exemplary embodiment, the photo mask 800 may have a plan shape of a polygonal shape. The photo mask 800 may have a transflective region 50 and a light shielding region 60 surrounding the transflective region 50. In one exemplary embodiment, for example, the transflective region 50 may transmit a portion of a light, and may block a remaining portion of the light. In such an embodiment, the light shielding region 60 may block (or completely block) a light. Here, the transflective region 50 may include a first region 10, a second region 20, a third region 23, a fourth region 25, a fifth region 27, and an edge region 30.

The transflective member may be disposed in the transflective region 50 on the lower surface of the transparent substrate. The transflective member may transmit a portion of a light, and may block a remaining portion of the light. In such an embodiment, the transflective member may selectively transmit a light. In such an embodiment, the transflective member may have a different light transmittance in each of the first region 10, the second region 20, the third region 23, the fourth region 25, the fifth region 27 and the edge region 30, and a light transmittance of the transflective member may be gradually increased in a direction from the outside the transflective member into the inside of the transflective member. In such an embodiment, in a process for forming a photoresist pattern using the photo mask 800, a recess may be formed in an upper surface of the photoresist pattern since the transflective member has the different light transmittance in each of the first region 10, the second region 20, the third region 23, the fourth region 25, the fifth region 27 and the edge region 30.

In an exemplary embodiment, a light transmittance of the transflective member may be different according to a length of each of the first region 10, the second region 20, the third region 23, the fourth region 25, the fifth region 27 and the edge region 30 of the transflective member. The transmittance of the transflective member may be decreased in the order of the first region 10, the second region 20, the third region 23, the fourth region 25, the fifth region 27 and the edge region 30. In such an embodiment, a length of a region may be decreased in the order of the first region 10, the second region 20, the third region 23, the fourth region 25, the fifth region 27, and the edge region 30.

In an exemplary embodiment, the photo mask 800 includes the transflective member having a different light transmittance in each of the first region 10, the second region 20, the third region 23, the fourth region 25, the fifth region 27 and the edge region 30, such that the photo mask 800 may control the amount of photoresist to be reflowed in an outer portion of the photoresist pattern in a process for forming the photoresist pattern by using the photo mask 800. Accordingly, substantially the same taper angle may be obtained in the outer portion of the photoresist pattern after a post bake process.

In an exemplary embodiment, as illustrated in FIGS. 4 through 8B, when a photo mask has a plan shape of a polygonal shape, substantially the same taper angle may be obtained in an outer portion of the photoresist pattern after a post bake process by controlling a width of the transflective member.

Figure 12B:
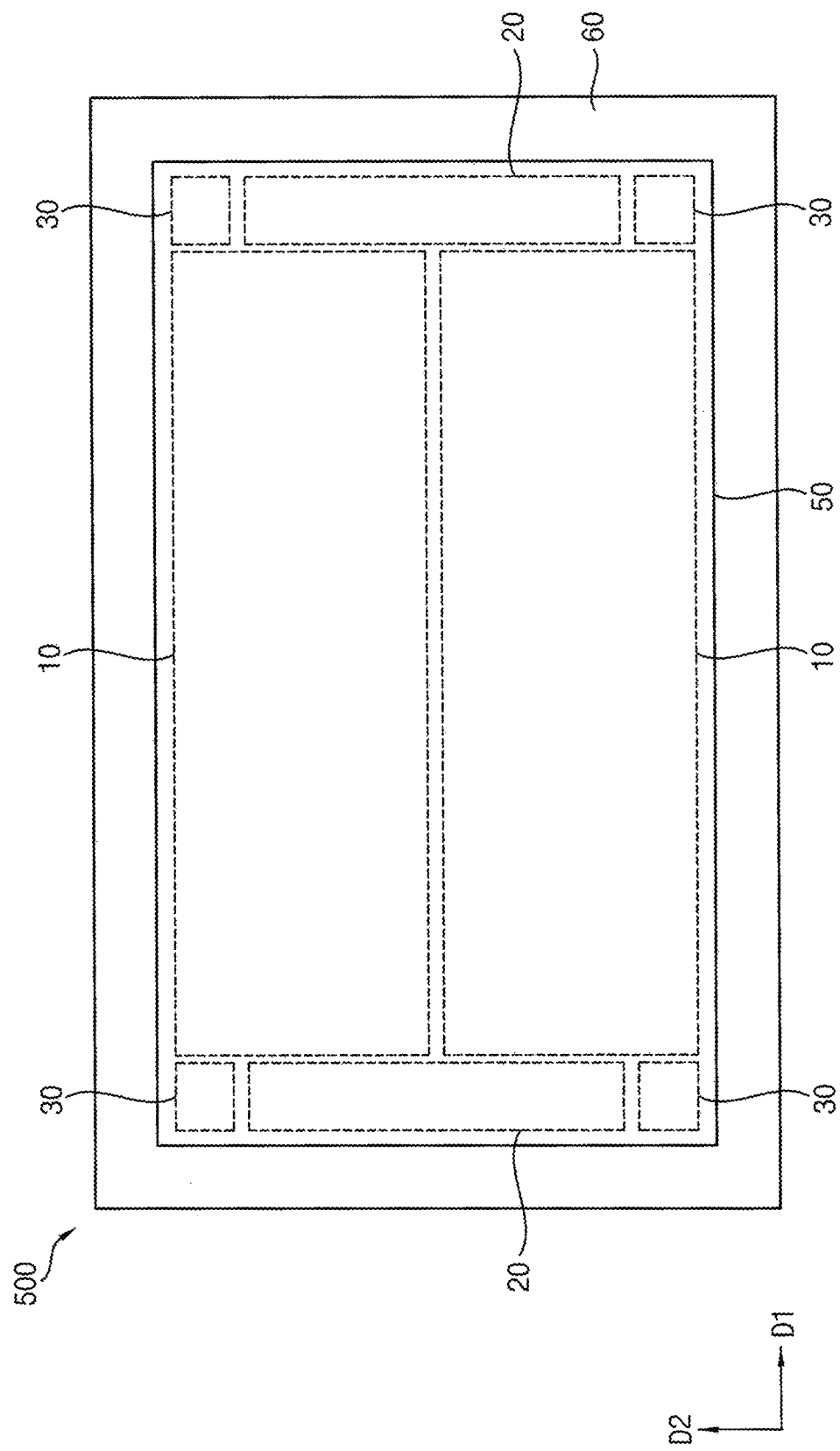
Figure 13:
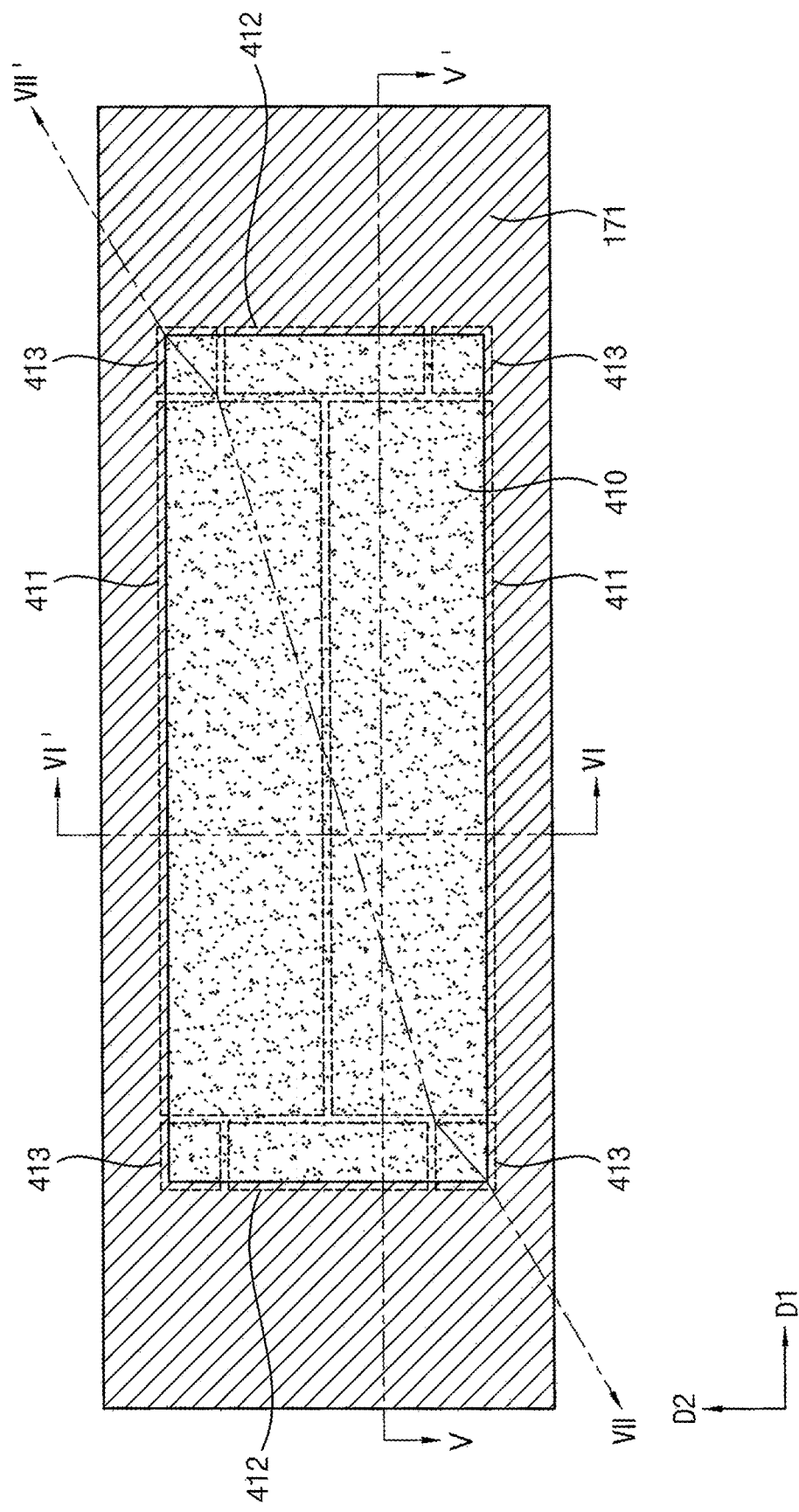
Figure 14:
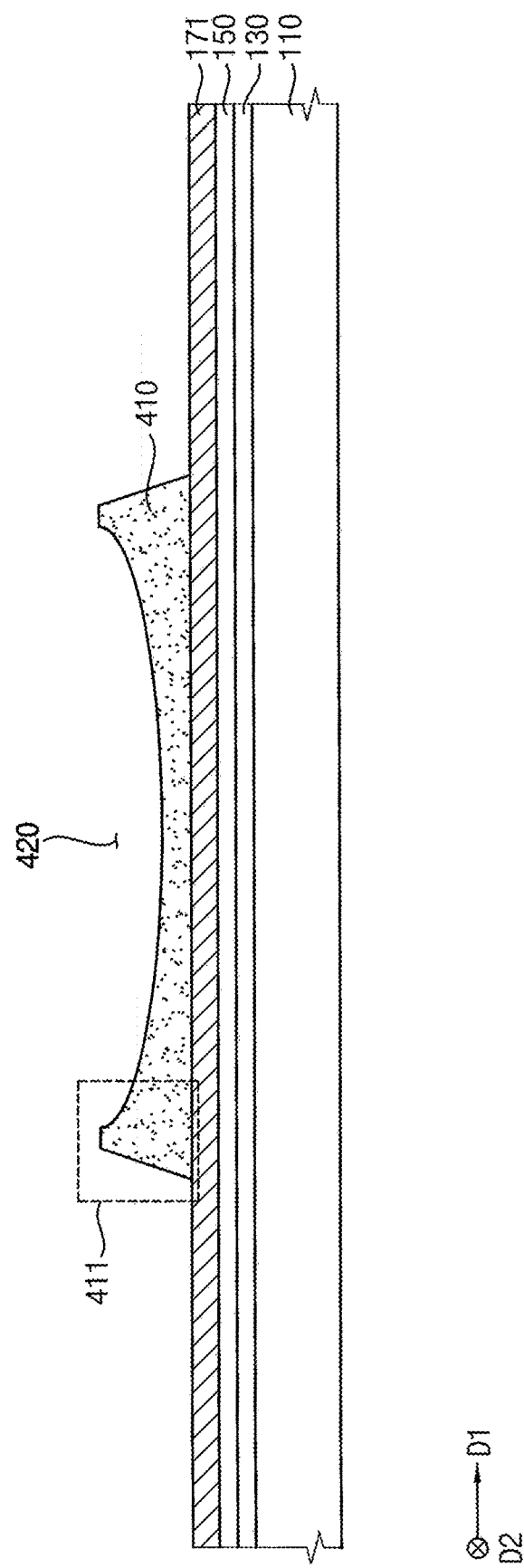
Figure 15:
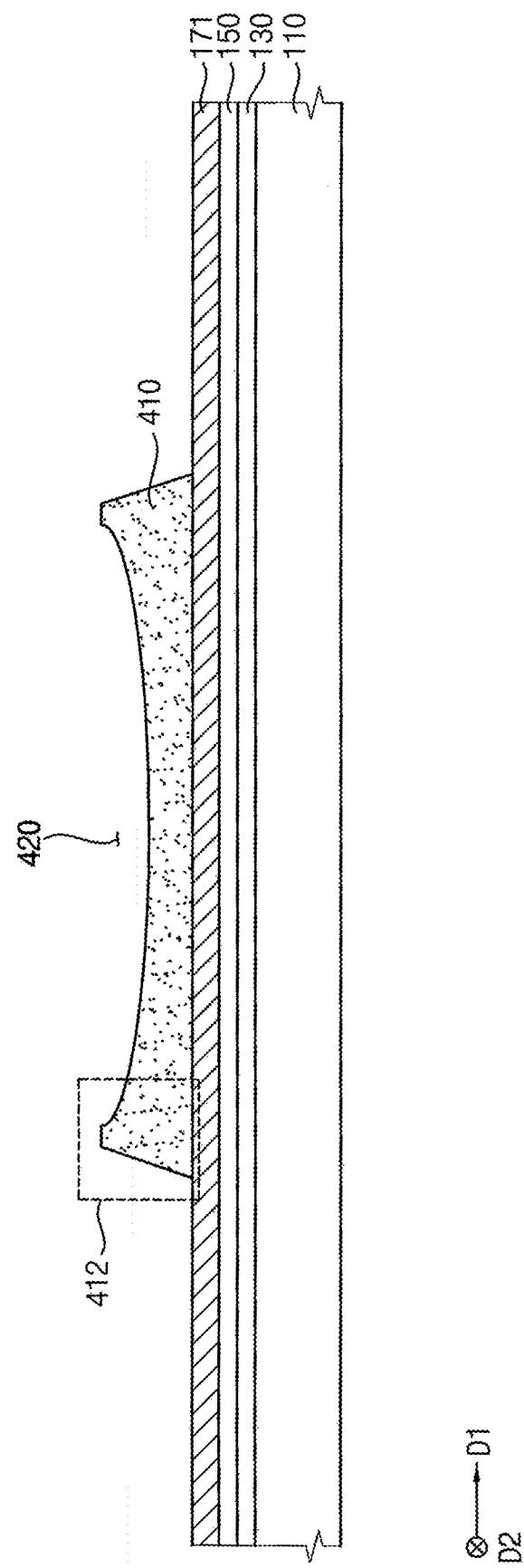
Figure 16:
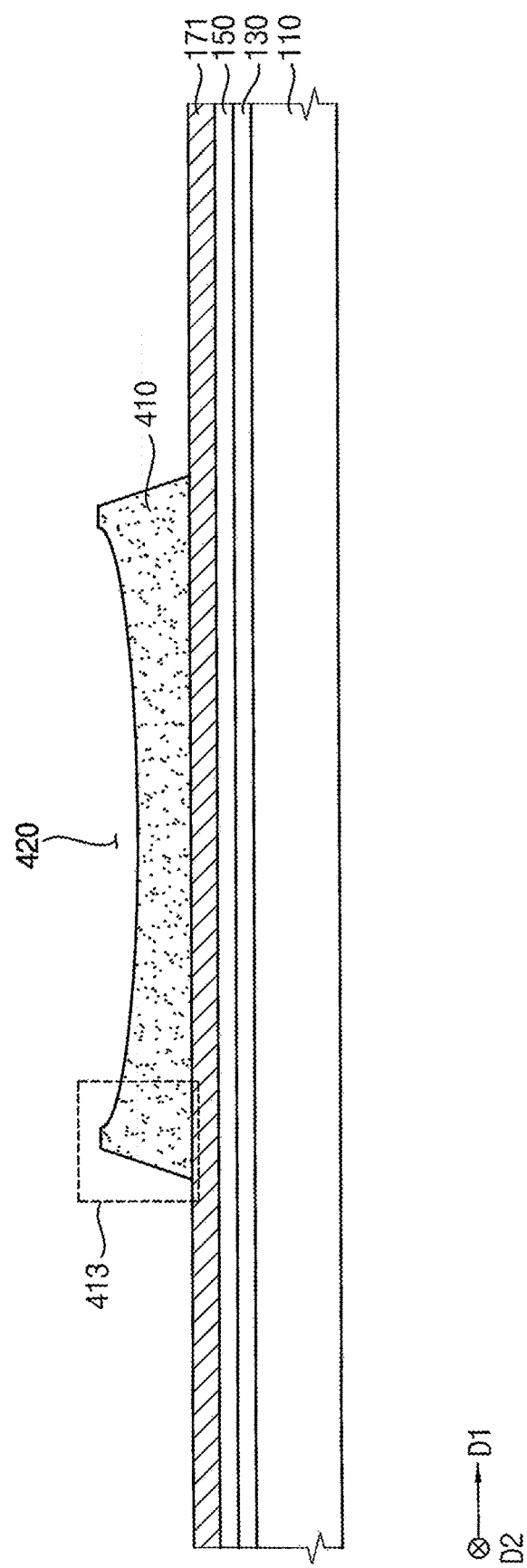

FIGS. 10 through 25 are cross-sectional views illustrating a method of manufacturing a semiconductor element using a photo mask in accordance with an exemplary embodiment. More particularly, FIG. 12B is a plan view illustrating a photo mask of FIG. 12A, and FIG. 12C is a plan view of a light shielding member included in a photo mask of FIG. 12A. FIG. 13 is a plan view of a first photoresist pattern formed using a photo mask of FIG. 12A, and FIG. 14 is a cross-sectional view taken along line V-V' of FIG. 13. FIG. 15 is a cross-sectional view taken along line VI-VI' of FIG. 13, and FIG. 16 is a cross-sectional view taken along line VII-VII' of FIG. 13.

Figure 10:
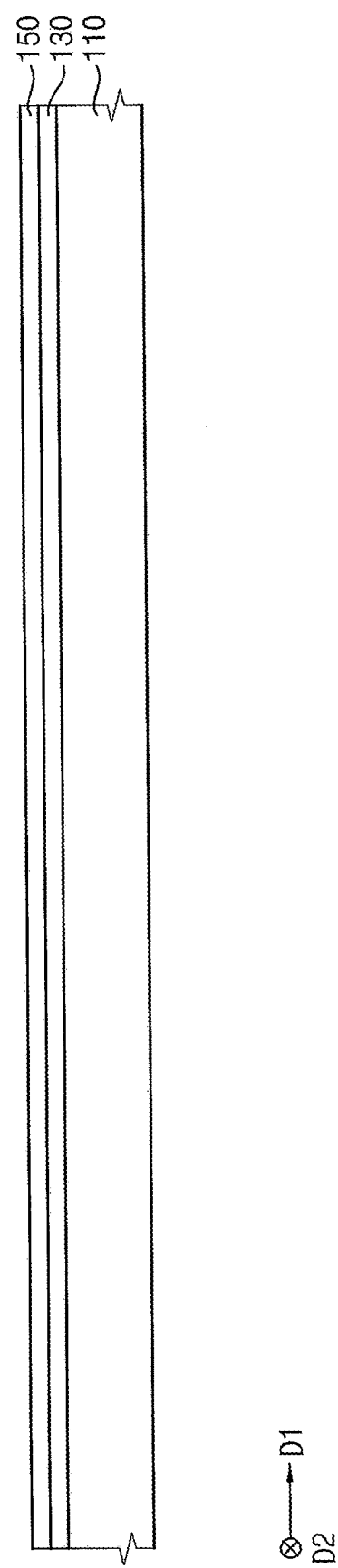

Referring to FIG. 10, in an exemplary embodiment of a method of manufacturing a semiconductor element, a substrate 110 may be prepared. The substrate 110 may include a transparent or opaque material. In one exemplary embodiment, for example, the substrate 110 may be formed using a quartz substrate, a synthetic quartz substrate, a calcium fluoride substrate, a fluoride-doped quartz substrate, a sodalime glass substrate or a non-alkali glass substrate, for example. Alternatively, the substrate 110 may be formed using a flexible transparent resin substrate.

A buffer layer (not shown) may be provided or formed on the substrate 110. The buffer layer may be formed to cover an entire surface of the substrate 110. The buffer layer may effectively prevent the diffusion of metal atoms and/or impurities from the substrate 110 into a semiconductor element. Additionally, the buffer layer may control a rate of a heat transfer in a crystallization process for forming an active pattern, thereby obtaining substantially uniform the active pattern. Furthermore, the buffer layer may improve a surface flatness of the substrate 110 when a surface of the substrate 110 is relatively irregular. According to a type of the substrate 110, at least two buffer layers may be provided on the substrate 110, or the buffer layer may be omitted. In one exemplary embodiment, for example, the buffer layer may be formed using an organic materials or inorganic material.

An active layer pattern 130 may be formed on the substrate 110. In one exemplary embodiment, for example, after a preliminary active layer is formed on the entire substrate 110, the active pattern 130 may be formed by partially removing the preliminary active layer. The active pattern 130 may include an oxide semiconductor, an inorganic semiconductor or an organic semiconductor, for example. In an alternative exemplary embodiment, the active pattern 130 may be formed using a polysilicon.

In an exemplary embodiment, an active layer may be provided or formed on the substrate 110. The active layer may function as a wiring. In one exemplary embodiment, for example, the active layer may be a data signal wiring for providing a data signal, a gate signal wiring for providing a gate signal, an initialization signal wiring for providing an initialization signal, an emission signal wiring for providing an emission signal or a power supply voltage wiring for providing a power supply voltage. In one exemplary embodiment, for example, the active pattern 130 may extend in a first direction D1, and may be electrically connected to the active layer. Here, the first direction D1 may be parallel to an upper surface of the substrate 110.

A gate insulation layer 150 may be provided or formed on the substrate 110 and the active pattern 130. The gate insulation layer 150 may cover the active pattern 130 on the substrate 110 and extend in the first direction D1, and may be disposed on an entire surface of the substrate 110. In one exemplary embodiment, for example, the gate insulation layer 150 may sufficiently cover the active pattern 130, and may have a substantially level surface without a step around the active pattern 130. Alternatively, the gate insulation layer 150 may cover the active pattern 130 on the substrate 110, and may be formed with a substantially uniform thickness along a profile of the active pattern 130. The gate insulation layer 150 may include a silicon compound, or a metal oxide, for example. In one exemplary embodiment, for example, the gate insulation layer 150 may be formed using silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), or a combination thereof.

Figure 11:
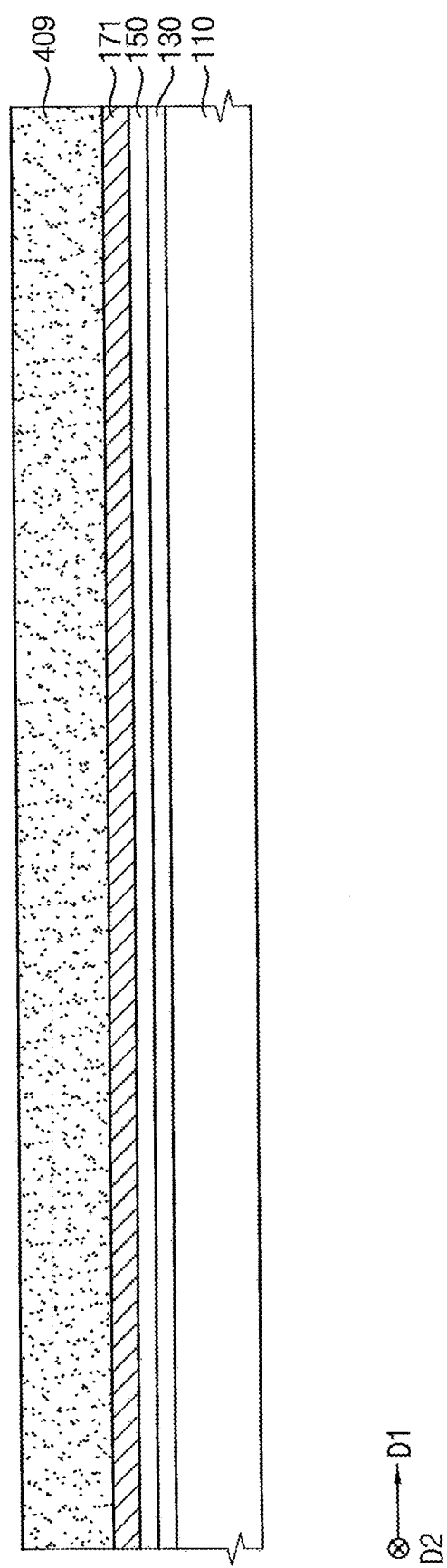

Referring to FIG. 11, a preliminary gate electrode layer 171 may be provided or formed on the gate insulation layer 150. The preliminary gate electrode layer 171 may extend in the first direction D1 on the gate insulation layer 150, and may be formed on the entire gate insulation layer 150. The preliminary gate electrode layer 171 may be formed using gold (Au), silver (Ag), aluminum (Al), platinum (Pt), nickel (Ni), titanium (Ti), palladium (Pd), magnesium (Mg), Calcium (Ca), lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide ("SRO"), zinc oxide (ZnOx), indium tin oxide ("ITO"), stannum oxide (SnOx), indium oxide (InOx), gallium oxide (GaOx), indium zinc oxide ("IZO"), or a combination thereof, for example. In an exemplary embodiment, the preliminary gate electrode layer 171 may have a single layer structure or a multi-layered structure.

A photoresist 409 may be provided or formed on the preliminary gate electrode layer 171. The photoresist 409 may be formed using a photosensitive resin Referring to FIG. 12A, a photo mask 500 may be positioned on the photoresist 409. The photo mask 500 may include a transparent substrate 510, a transflective member 530, and a light shielding member 550.

Referring to FIG. 12B, the photo mask 500 may have a transflective region 50 and a light shielding region 60 surrounding the transflective region 50. In one exemplary embodiment, for example, the transflective region 50 may transmit a portion of a light, and may block a remaining portion of the light. In such an embodiment, the light shielding region 60 may block (or completely block) a light. In such an embodiment, the transflective region 50 may include a first region 10, a second region 20, and an edge region 30. In one exemplary embodiment, for example, the first region 10 may be located at the center in the transflective region 50, and the second region 20 may be located in opposing lateral portions of the first region 10. In such an embodiment, the edge region 30 may be located adjacent to the first and second regions 10 and 20. In such an embodiment, the edge region 30 may be located adjacent to an edge portion of the transflective region 50.

Referring to FIG. 12C, the light shielding member 550 may define an opening 560 that exposes the transflective region 50, and may have a long side, a short side, and an intersection portion. Here, the long side may extend in a first direction D1, and the short side may extend in a second direction D2 that is different from the first direction D1 (e.g., the second direction D2 may be perpendicular to the first direction D1). The intersection portion may be located in a portion where the long side crosses the short side. In such an embodiment, the long side may be located adjacent to the first region 10, and the short side may be located adjacent to second region 20. The intersection portion may be located adjacent to the edge region 30 (refer to FIG. 12B). Here, the long side may include a first long side 551 and a second long side 553, and the short side may include a first short side 552 and a second short side 554. The intersection portion may include a first intersection portion 555, a second intersection portion 556, a third intersection portion 557, and a fourth intersection portion 558. In one exemplary embodiment, for example, the first long side 551 may be located in the top of the first region 10, and the second long side 553 may be located in the bottom of the first region 10. The first long side 551 may face the second long side 553 to each other. In such an embodiment, the first long side 551 may be opposite to the second long side 553. In such an embodiment, each of the first short side 552 and the second short side 554 may be located adjacent to the second region 20, and the first short side 552 may face the second short side 554. In such an embodiment, the first intersection portion 555 may be located in a portion where the first long side 551 crosses the first short side 552, and the second intersection portion 556 may be located in a portion where the first long side 551 crosses the second short side 554. The third intersection portion 557 may be located in a portion where the second long side 553 crosses the first short side 552, and the fourth intersection portion 558 may be located in a portion where the second long side 553 crosses the second short side 554.

Referring again to FIG. 12A, the transflective member 530 and the light shielding member 550 may be provided or formed on a lower surface of the transparent substrate 510.

The transparent substrate 510 may be formed using a transparent material that transmits a light. As the photo mask 500 has the transflective region 50 and the light shielding region 60, the transparent substrate 510 may be divided into the transflective region 50 and the light shielding region 60. The transparent substrate 510 may include a quartz substrate, a synthetic quartz substrate, a calcium fluoride substrate, a fluoride-doped quartz substrate, a sodalime glass substrate, or a non-alkali glass substrate, for example.

In an exemplary embodiment, the transflective member 530 may be formed on the lower surface of the transparent substrate 510. In such an embodiment, the transflective member 530 may be formed in the first region 10, the second region 20 and the edge region 30 on the lower surface of the transparent substrate 510. In an exemplary embodiment, the transflective member 530 may transmit a portion of a light, and may block a remaining portion of the light. In such an embodiment, the transflective member 530 may selectively transmit a light. In such an embodiment, the transflective member 530 may have a different light transmittance in each of the first region 10, the second region 20 and the edge region 30, and a light transmittance of the transflective member 530 may be gradually increased in a direction from the outside the transflective member 530 into the inside of the transflective member 530. A light transmittance of the transflective member 530 that is located in the first region 10 may be greater than a light transmittance of the transflective member 530 that is located in the second region 20, and a light transmittance of the transflective member 530 that is located in the edge region 30 may be less than the transmittance of the transflective member 530 that is located in the second region 20. In such an embodiment, a light transmittance of the transflective member 530 may be decreased in the order of the first region 10, the second region 20, and the edge region 30. The transflective member 530 may be formed using MoSi, MoSiN, MoSiCN, MoSiON or MoSiCON, for example. In one exemplary embodiment, for example, where the transflective member 530 includes MoSiON, a light transmittance may be controlled by appropriately adjusting the composition ratio of Si, O, and N.

The light shielding member 550 may be provided or formed in the light shielding region 60 on a lower surface of the transflective member 530. The light shielding member 550 may block a light. In an exemplary embodiment, since UV may not be irradiated in a first portion that corresponds to the light shielding member 550, a photoresist pattern may be formed in the first portion. In such an embodiment, since UV may be irradiated in a second portion where the light shielding member 550 is not located, the photoresist pattern may be removed in the second portion (e.g., a positive type photoresist). The light shielding member 550 may define the opening 560 that exposes the transflective region 50, and may include the first long side 551, the second long side 553, the first short side 552, the second short side 554, the first intersection portion 555, the second intersection portion 556, the third intersection portion 557 and the fourth intersection portion 558. The light shielding member 550 may be formed using Ti, V, Co, Ni, Zr, Nb, Pd, Zn, Cr, Mn, Al, Mn, Cd, Mg, Li, Se, Cu, Mo, Hf, Ta, W, Si, or a combination thereof, for example.

Referring to FIGS. 13, 14, 15 and 16, a first photoresist pattern 410 including a recess 420 that has a thickness gradually decreasing along a direction from the outside into the inside on a portion of the preliminary gate electrode layer 171 may be formed by performing an exposure process using the light shielding member 550. The first photoresist pattern 410 may overlap the transflective region 50 and the light shielding region 60 of the photo mask 500, and the recess 420 may be formed in the first photoresist pattern 410 through the transflective region 50. In an exemplary embodiment, as illustrated in FIG. 13, the first photoresist pattern 410 may have a first side portion 411 and a second side portion 412 and an edge portion 413. The first side portion 411 may correspond to the first region 10, and the second side portion 412 may correspond to the second region 20. In such an embodiment, the edge portion 413 may correspond to the edge region 30.

When a post bake process, which will be described below, is performed, the amount of photoresist to be reflowed in the second side portion 412 may be relatively large since the amount of photoresist that is located in the first side portion 411 is greater than the amount of photoresist that is located in the second side portion 412. In addition, when the post bake process is performed, the amount of photoresist to be reflowed in the edge portion 413 may be relatively small since the amount of photoresist that is located in the edge portion 413 is less than the amount of photoresist that is in the second side portion 412. That is, the amount of photoresist to be reflowed in each of the first side portion 411, the second side portion 412, and the edge portion 413 may be different from each other, and the amount of photoresist to be reflowed may be different according to a shape of the outer portion of the photoresist pattern when the post bake process is performed.

In an exemplary embodiment, the photo mask 500 may control the amount of photoresist located in the first side portion 411, the second side portion 412 and the edge portion 413 of the first photoresist pattern 410 to effectively prevent the difference in the amount of photoresist to be reflowed.

In an exemplary embodiment, as illustrated in FIGS. 14, 15 and 16, a light transmittance of the transflective member 530 located in the first region 10 of the photo mask 500 corresponding to the first side portion 411 of the first photoresist pattern 410 may be greater than a light transmittance of the transflective member 530 located in the second region 20 of the photo mask 500 corresponding to the second side portion of the first photoresist pattern 410, and a slope of the recess 420 located in the first side portion 411 of the first photoresist pattern 410 may be steeper than a slope of the recess 420 located in the second side portion 412 of the first photoresist pattern 410. In such an embodiment, a light transmittance of the transflective member 530 located in the second region 20 of the photo mask 500 corresponding to the second side portion 412 of the first photoresist pattern 410 may be greater than a light transmittance of the transflective member 530 located in the edge region 30 of the photo mask 500 corresponding to the edge portion 413 of the first photoresist pattern 410, and a slope of the recess 420 located in the second side portion 412 of the first photoresist pattern 410 may be steeper than a slope of the recess 420 located in the edge portion 413 of the first photoresist pattern 410. In such an embodiment, a light transmittance of the transflective member 530 located in the edge region 30 of the photo mask 500 corresponding to the edge portion 413 of the first photoresist pattern 410 may be less than a light transmittance of the transflective member 530 located in the first and second regions 10 and 20 of the photo mask 500 corresponding to each of the first and second side portions 411 and 412 of the first photoresist pattern 410, and a slope of the recess 420 located in the edge portion 413 of the first photoresist pattern 410 may be more gradual or gentle (or less steeper) than a slope of the recess 420 located in each of the first and second side portions 411 and 412 of the first photoresist pattern 410.

In such an embodiment, since a slope of the recess 420 of the first photoresist pattern 410 is relatively steep in the first side portion 411 of the first photoresist pattern 410, a relatively small amount of photoresist may be located in the first side portion 411 of the first photoresist pattern 410, and the amount of photoresist to be reflowed may be relatively reduced when the post bake process is performed. In such an embodiment, since a slope of the recess 420 of the first photoresist pattern 410 is relatively gradual in the edge portion 413 of the first photoresist pattern 410, a relatively large amount of photoresist may be located in the edge portion 413 of the first photoresist pattern 410, and the amount of photoresist to be reflowed may be relatively increased when the post bake process is performed. Accordingly, a substantially same taper angle may be obtained in the first side portion 411, the second side portion 412, and the edge portion 413 of the first photoresist pattern 410 after the post bake process.

Referring to FIG. 17, the post bake process may be performed in the first photoresist pattern 410. As described above, when the post bake process is performed, a reflow phenomenon may occur in the first photoresist pattern 410.

The post bake process may remove water or moisture inside of the first photoresist pattern 410, and may increase a bonding strength of the first photoresist pattern 410. In one exemplary embodiment, for example, the post bake process may be performed at about 135° C. for 120 seconds.

Figure 18A:
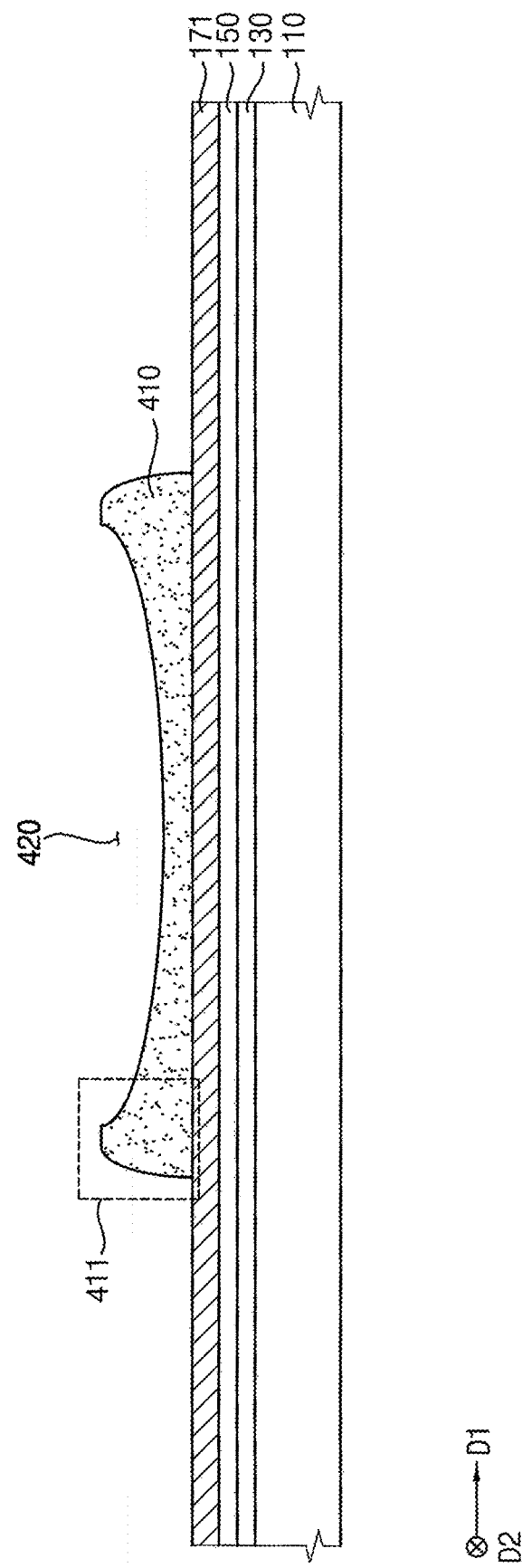
Figure 18C:
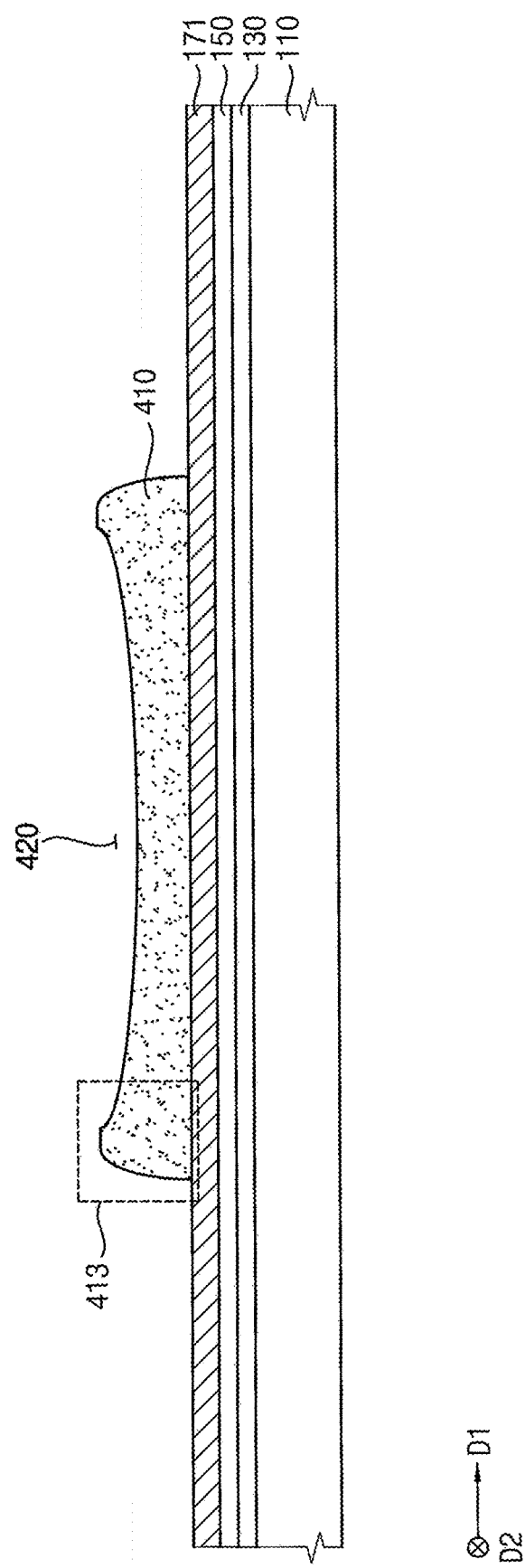

Referring to FIGS. 18A, 18B and 18C, a substantially same taper angle may be obtained in the first side portion 411, the second side portion 412, and the edge portion 413 after the post bake process.

Figure 19:
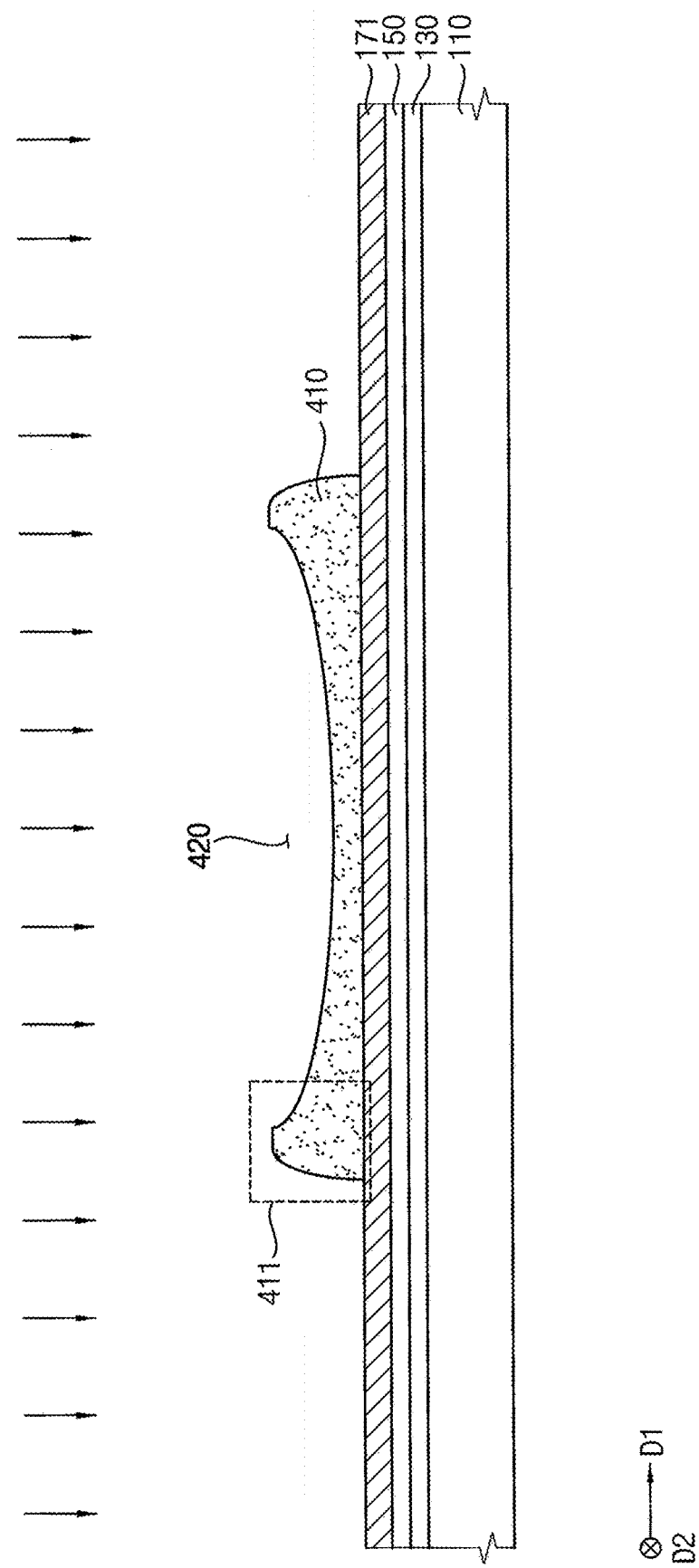

Referring to FIG. 19, after the first photoresist pattern 410 having a substantially same taper angle in the first side portion 411, the second side portion 412 and the edge portion 413 is formed, the preliminary gate electrode layer 171 may be partially removed using the first photoresist pattern 410 as a mask. In one exemplary embodiment, for example, a first etch process may be performed in the preliminary gate electrode layer 171.

Figure 20:
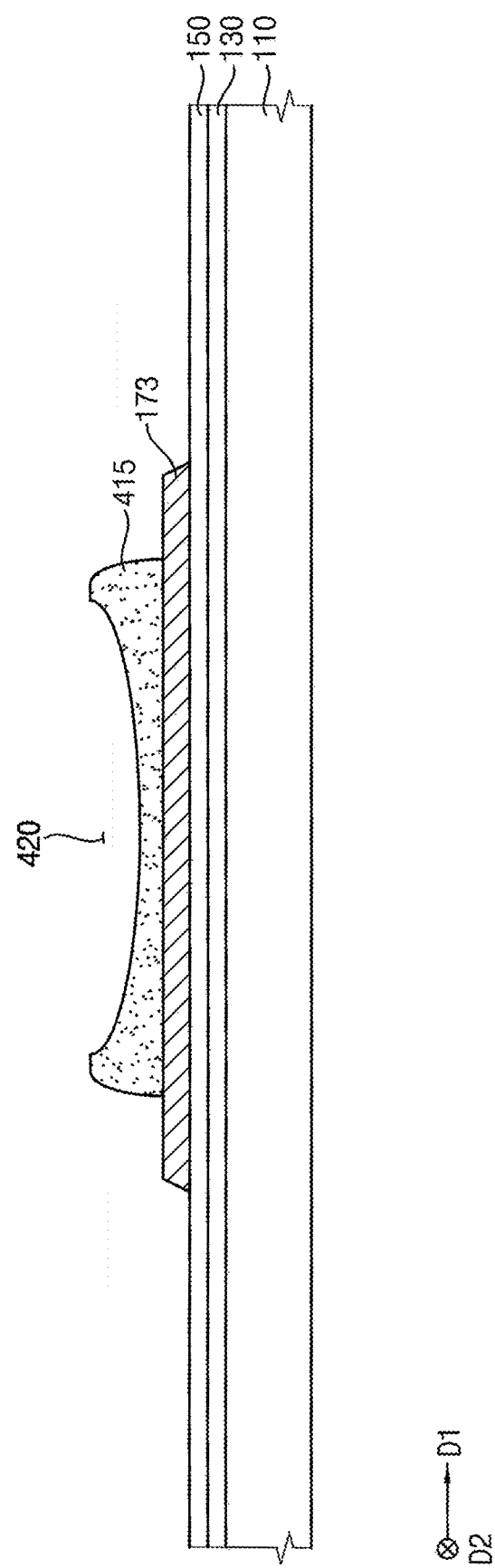

Referring to FIG. 20, after the first etch process is performed in the preliminary gate electrode layer 171, a first gate electrode pattern 173 may be formed on the active pattern 130. In an exemplary embodiment, while the first etch process is performed, a size of the first photoresist pattern 410 may be less than a previously size (e.g., a state before the first etch process). The first photoresist pattern 410 having a reduced size may be defined as a second photoresist pattern 415.

Figure 21:
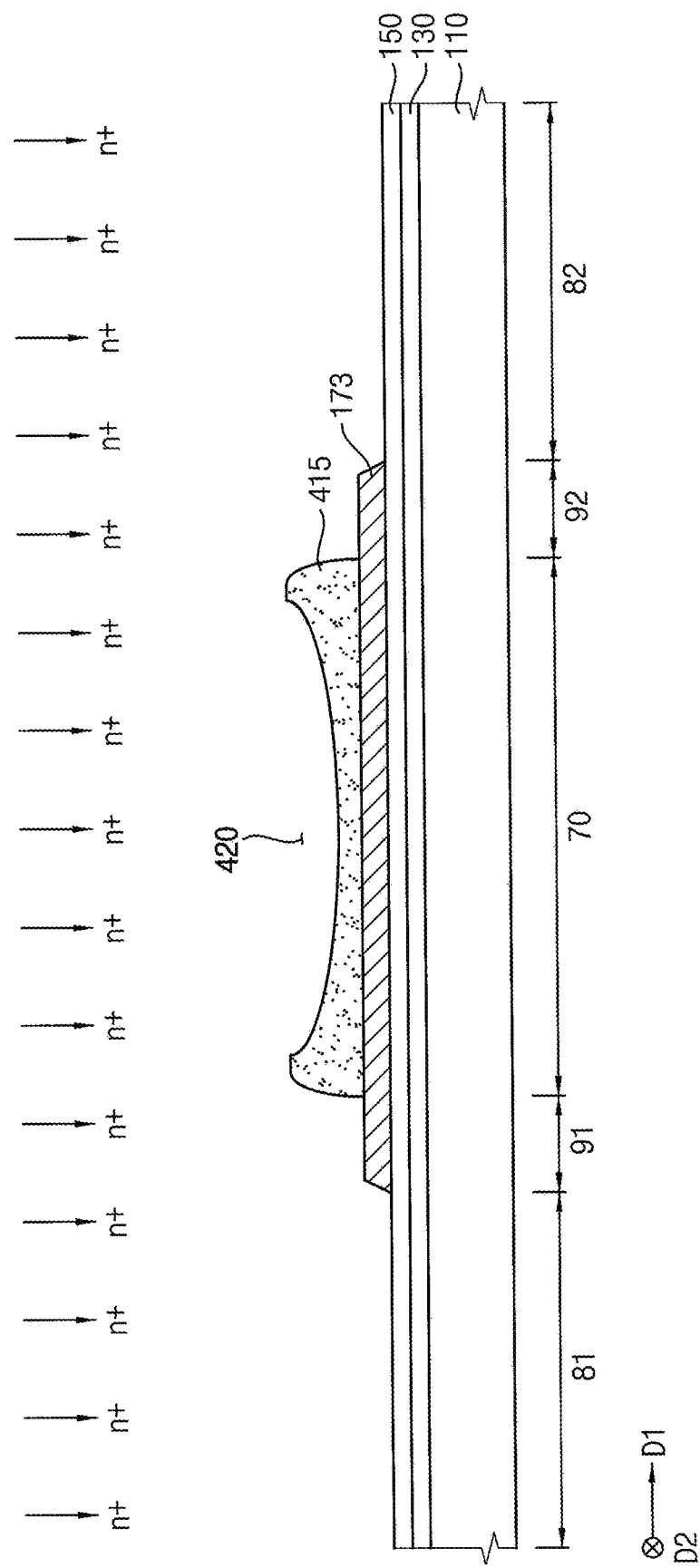

Referring to FIG. 21, after the first gate electrode pattern 173 is formed, a high concentration ion doping n+ may be performed on the substrate 110. After high concentration ion doping n+ is performed, a first high concentration doping region 81 and a second high concentration doping region 82 may be formed in the active pattern 130. In such an embodiment, the ion may be boron (B) ion or phosphorus (P) ion, for example.

Figure 22:
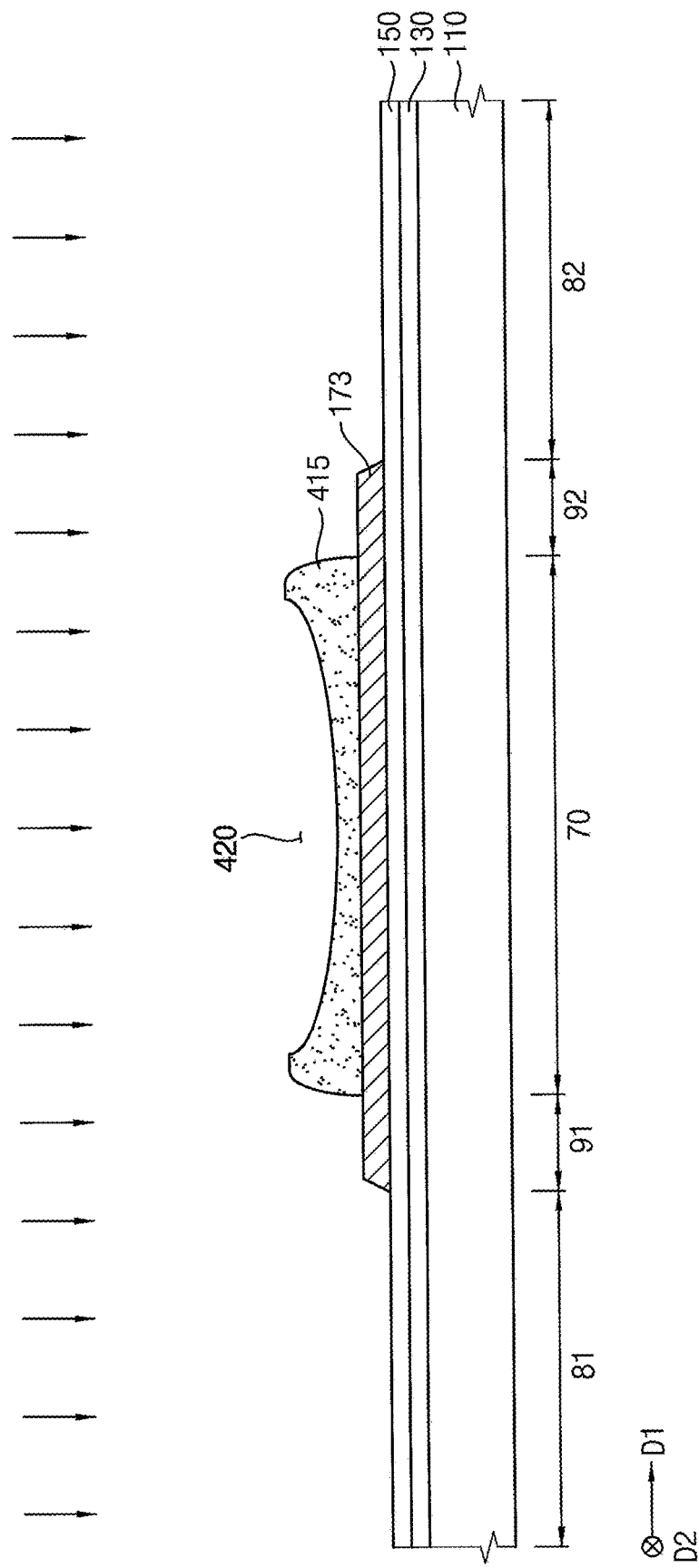

Referring to FIG. 22, the first gate electrode pattern 173 may be partially removed by using the second photoresist pattern 415 as a mask. In one exemplary embodiment, for example, a second etch process may be performed in the first gate electrode pattern 173.

Figure 23:
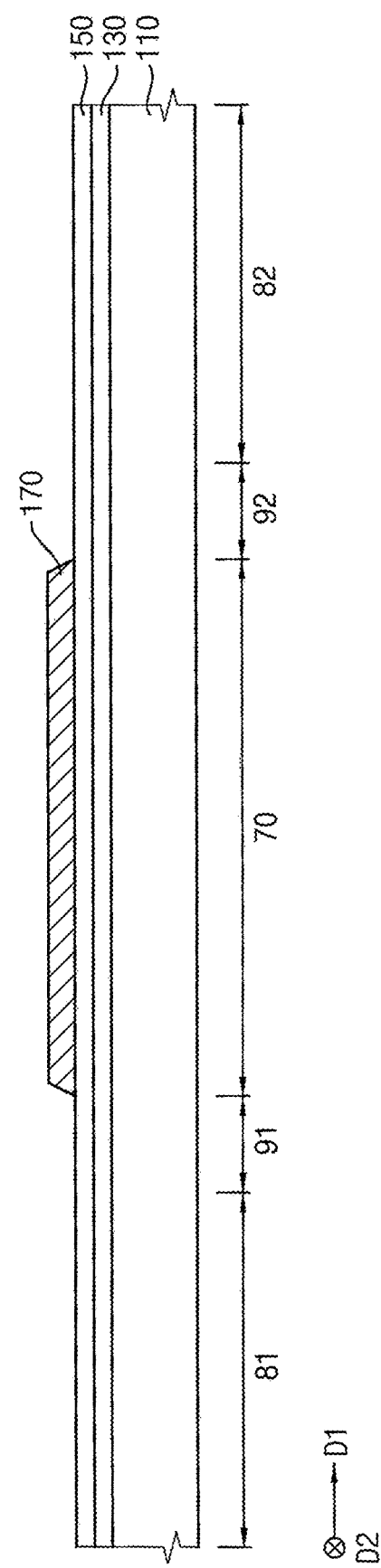

Referring to FIG. 23, after the second etch process is performed in the first gate electrode pattern 173, a second gate electrode pattern 170 may be formed on the active pattern 130.

Figure 24:
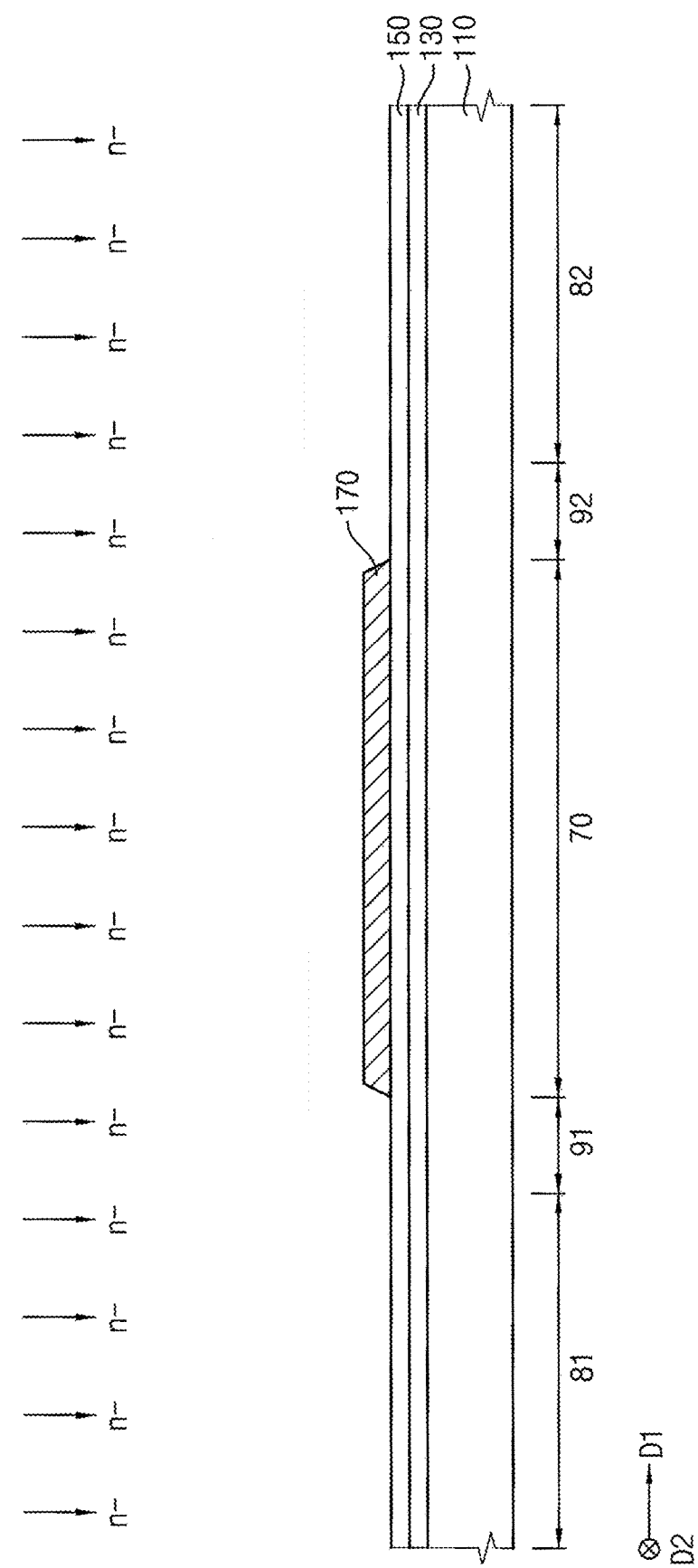

Referring to FIG. 24, after the second gate electrode pattern 170 is formed, a low concentration ion doping n- may be performed on the entire substrate 110.

After the low concentration ion doping n- is performed, a first low concentration doping region 91, a second low concentration doping region 92 and an undoped region 70 may be formed in the active pattern 130. In such an embodiment, the active pattern 130 may have an LDD region. The first and second high concentration doping region 81 and 82 may surround the first and second low concentration doping region 91 and 82.

Figure 25:
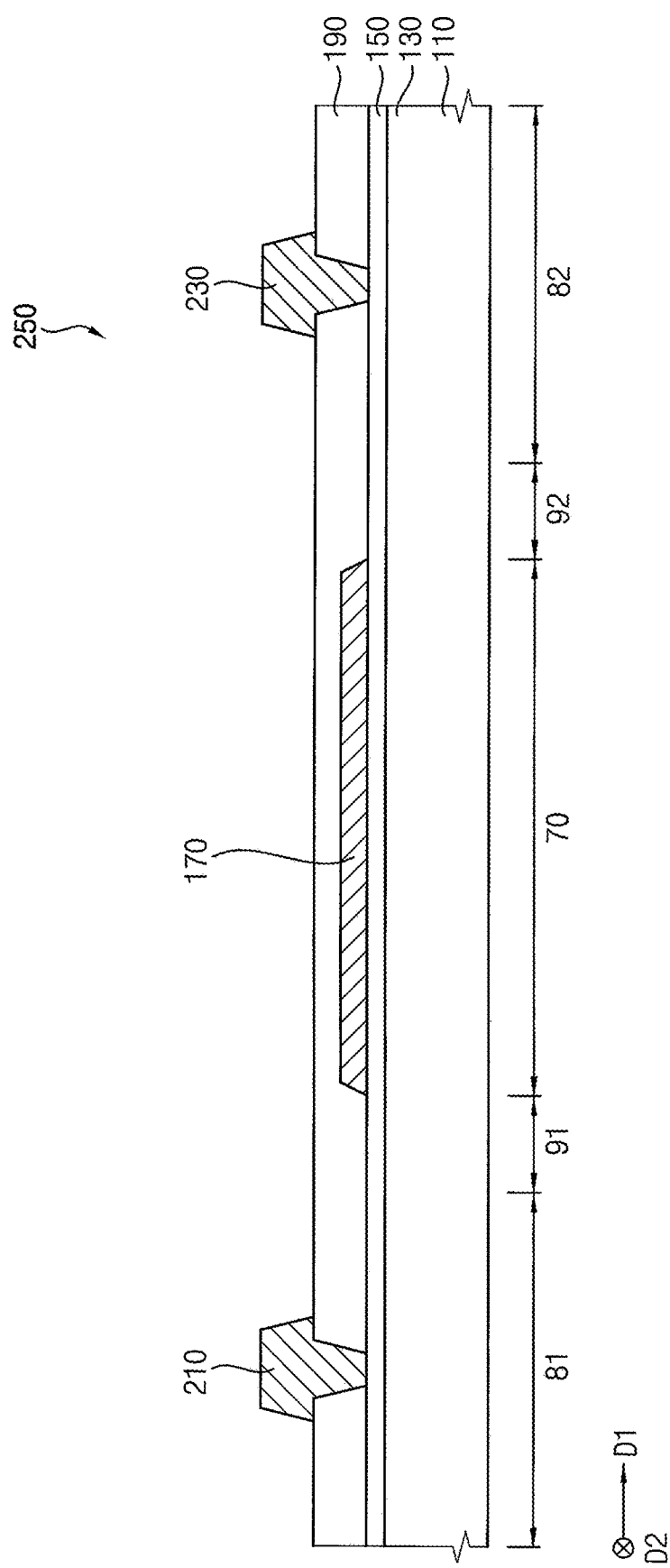

Referring to FIG. 25, an insulating interlayer 190 may be provided or formed on the gate insulation layer 150 and the second gate electrode pattern 170. The insulating interlayer 190 may cover the second gate electrode pattern 170 on the gate insulation layer 150, may be formed on an entire surface of the gate insulation layer 150. In one exemplary embodiment, for example, the insulating interlayer 190 may sufficiently cover the second gate electrode pattern 170, and may have a substantially flat surface without a step around the second gate electrode pattern 170. Alternatively, the insulating interlayer 190 may cover the second gate electrode pattern 170, and may be formed with a substantially uniform thickness along a profile of the second gate electrode pattern 170. The insulating interlayer 190 may be formed using a silicon compound or a metal oxide, for example.

Source electrode 210 and the drain electrode 230 may be provided or formed on the insulating interlayer 190. The source electrode 210 may be in direct contact with the first high concentration doping region 81 of the active pattern 130 via a contact hole formed by removing a portion of the gate insulation layer 150 and the insulating interlayer 190. The drain electrode 230 may be in direct contact with the second high concentration doping region 82 of the active pattern 130 via a contact hole formed by removing another portion of the gate insulation layer 150 and the insulating interlayer 190. Each of the source electrode 210 and the drain electrode 230 may be formed using a metal, an alloy of a metal, metal nitride, conductive metal oxide, transparent conductive materials, or a combination thereof, for example. In an exemplary embodiment, each of the source and drain electrodes 210 and 230 may have a single layer structure or a multi-layered structure. Accordingly, a semiconductor element 250 may be formed using the photo mask 500.

In an exemplary embodiment, the semiconductor element 250 may further include a third gate electrode pattern overlapping the second gate electrode pattern 170 between the second gate electrode pattern 170 and the source and drain electrodes 210 and 230. In such an embodiment, the semiconductor element 250 may have a double gate structure. In such an embodiment, the semiconductor element 250 may further include a fourth gate electrode pattern and a fifth gate electrode pattern. The fourth gate electrode pattern may be spaced apart from the second gate electrode pattern 170, may be located at a same level with the second gate electrode pattern 170. In such an embodiment, the fifth gate electrode pattern may be spaced apart from the third gate electrode pattern, and may be located at the same level with the third gate electrode pattern. In such an embodiment, the fourth and fifth gate electrode patterns may function as a capacitor.

In an exemplary embodiment, a light emitting structure may be provided or formed on the semiconductor element 250. In one exemplary embodiment, for example, the light emitting structure may a lower electrode that is electrically to the semiconductor element 250, a light emitting layer formed on the lower electrode, and an upper electrode formed on the light emitting layer. In such an embodiment, an organic light emitting display device including the semiconductor element 250 may be manufactured.

In a method of manufacturing the semiconductor element 250 using the photo mask 500 in accordance with an exemplary embodiment, the photo mask 500 includes the transflective member 530 having a different light transmittance in each of the first region 10, the second region 20, and the edge region 30, such that the photo mask 500 may control the amount of photoresist to be reflowed in each of the first side portion 411, the second side portion 412, and the edge portion 413 of the first photoresist pattern 410 in a process for forming the first photoresist pattern 410 by using the photo mask 500. Accordingly, substantially the same taper angle may be obtained in the first side portion 411, the second side portion 412, and the edge portion 413 of the first photoresist pattern 410 after the post bake process. In such an embodiment, a CD skew may be within a tolerance range, and the semiconductor element 250 may be manufactured with no defect of the second gate electrode pattern 170.

Exemplary embodiments of the invention may be applied to various devices manufacturing a semiconductor element using a photo mask and applied to various display devices including a semiconductor element. Exemplary embodiments of the invention may be applied to vehicle-display device, a ship-display device, an aircraft-display device, portable communication devices, display devices for display or for information transfer, a medical-display device, etc.

The present should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A photo mask comprising:
   a transparent substrate including:
      a transflective region including a first region, a second region located in opposing lateral portions of the first region and an edge region located adjacent to the first and second regions; and
      a light shielding region surrounding the transflective region;
   a transflective member in the first, second and edge regions on a lower surface of the transparent substrate, wherein the transflective member has a different light transmittance in each of the first, second and edge regions; and
   a light shielding member in the light shielding region on the lower surface of the transparent substrate, wherein the light shielding member defines an opening which exposes the transflective region,
   wherein the light shielding member includes:
      a long side extending in a first direction parallel to an upper surface of the transparent substrate; and
      a short side extending in a second direction different from the first direction.

2. The photo mask of claim 1, wherein a light transmittance of the transflective member is gradually increased in a direction from an outside of the transflective member into an inside of the transflective member.

3. The photo mask of claim 1, wherein
   the long side is located adjacent to the first region, and
   the short side is located adjacent to the second region.

4. The photo mask of claim 1, wherein the light shielding member further includes:
   an intersection portion located in a portion where the long side crosses the short side,
   wherein the intersection portion is located adjacent to the edge region, and
   wherein a light transmittance of the transflective member located in the first region is greater than a light transmittance of the transflective member located in the second region, and a light transmittance of the transflective member located in the edge region is less than the light transmittance of the transflective member located in the second region.

5. The photo mask of claim 4, wherein
the long side of the light shielding member includes a first long side and a second long side facing the first long side,
the short side of the light shielding member includes a first short side and a second short side facing the first short side, and
the intersection portion of the shielding member includes:
   a first intersection portion located in a portion where the first long side crosses the first short side;
   a second intersection portion located in a portion where the first long side crosses the second short side;
   a third intersection portion located in a portion where the second long side crosses the first short side; and
   a fourth intersection portion located in a portion where the second long side crosses the second short side.

6. The photo mask of claim 5, wherein the edge region is located adjacent to the first, second, third and fourth intersection portions.

7. The photo mask of claim 1, wherein
the transflective member is disposed on an entire portion of the lower surface of the transparent substrate, and
the light shielding member is in direct contact with a lower surface of the transflective member.

8. The photo mask of claim 1, wherein
the transflective member is disposed in the opening of the light shielding member, and
the light shielding member is in direct contact with the lower surface of the transparent substrate.

9. A photo mask comprising:
a transparent substrate including a transflective region and a light shielding region surrounding the transflective region;
a transflective member on a lower surface of the transparent substrate; and
a light shielding member in the light shielding region on a lower surface of the transflective member, wherein the light shielding member defines an opening that exposes the transflective region,
wherein the light shielding member includes a long side extending in a first direction parallel to an upper surface of the transparent substrate and a short side extending in a second direction different from the first direction, and
wherein a width of the long side in the second direction is less than a width of the short side in the first direction.

10. The photo mask of claim 9, wherein the light shielding member further includes:
an intersection portion located in a portion where the long side crosses the short side,
wherein a width of the intersection portion in a diagonal direction is greater than the width of the short side.

11. The photo mask of claim 10, wherein
the long side of the light shielding member includes a first long side and a second long side facing the first long side,
the short side of the light shielding member includes a first short side and a second short side facing the first short side, and
the intersection portion of the shielding member includes:
   a first intersection portion located in a portion where the first long side crosses the first short side;
   a second intersection portion located in a portion where the first long side crosses the second short side;
   a third intersection portion located in a portion where the second long side crosses the first short side; and
   a fourth intersection portion located in a portion where the second long side crosses the second short side.

12. The photo mask of claim 9, wherein a light transmittance of the transflective member gradually increases in a direction from an outside of the transflective member into an inside of the transflective member.

* * * * *